(12) United States Patent
Visconti et al.

(10) Patent No.: US 12,266,394 B2
(45) Date of Patent: Apr. 1, 2025

(54) ROBUST FUNCTIONALITY FOR MEMORY MANAGEMENT ASSOCIATED WITH HIGH-TEMPERATURE STORAGE AND OTHER CONDITIONS

(71) Applicant: Micron Technology, Inc., Boise, ID (US)

(72) Inventors: Angelo Visconti, Appiano Gentile (IT); Jonathan J. Strand, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 303 days.

(21) Appl. No.: 17/831,368

(22) Filed: Jun. 2, 2022

(65) Prior Publication Data
US 2023/0395115 A1    Dec. 7, 2023

Related U.S. Application Data

(60) Provisional application No. 63/347,870, filed on Jun. 1, 2022.

(51) Int. Cl.
*G11C 11/22* (2006.01)

(52) U.S. Cl.
CPC ........ *G11C 11/2297* (2013.01); *G11C 11/221* (2013.01); *G11C 11/2275* (2013.01)

(58) Field of Classification Search
CPC ............. G11C 11/2297; G11C 11/221; G11C 11/2275
USPC ........................................................ 365/145
See application file for complete search history.

(56) References Cited

U.S. PATENT DOCUMENTS

| | | | | |
|---|---|---|---|---|
| 9,697,913 | B1* | 7/2017 | Mariani | G11C 11/2273 |
| 11,221,915 | B2* | 1/2022 | Gim | G11C 29/021 |
| 11,409,348 | B2* | 8/2022 | Suljic | G11C 5/141 |
| 2021/0089385 | A1* | 3/2021 | Basuta | G11C 11/2273 |
| 2021/0319843 | A1* | 10/2021 | Harms | G11C 11/221 |
| 2023/0024961 | A1* | 1/2023 | Kitagawa | G11C 11/2293 |

* cited by examiner

*Primary Examiner* — Connie C Yoha
(74) *Attorney, Agent, or Firm* — Holland & Hart LLP

(57) ABSTRACT

Methods, systems, and devices for robust functionality for memory management associated with high-temperature storage are described. A memory device may apply a pattern (e.g., an imprint conditioning or deletion pattern) to at least a portion of memory cells of a memory array associated with a memory device before or after a power state procedure. The memory device may determine the pattern from various possible patterns, where the pattern may indicate a data state for each memory cell of the portion of memory cells. The pattern may indicate a same data state for each memory cell, an alternating data state for each memory cell, or an asymmetric switching pattern over a plurality of cycles, or any combination thereof. The memory device may write a respective logic value to at least some of the one or more memory cells of the portion of memory cells according to the pattern.

25 Claims, 8 Drawing Sheets

ROBUST FUNCTIONALITY FOR MEMORY MANAGEMENT ASSOCIATED WITH HIGH-TEMPERATURE STORAGE AND OTHER CONDITIONS

CROSS REFERENCE

The present Application for Patent claims the benefit of U.S. Provisional Patent Application No. 63/347,870 by Visconti, entitled "ROBUST FUNCTIONALITY FOR MEMORY MANAGEMENT ASSOCIATED WITH HIGH-TEMPERATURE STORAGE AND OTHER CONDITIONS," filed Jun. 1, 2022, assigned to the assignee hereof, and expressly incorporated by reference herein in its entirety.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

DETAILED DESCRIPTION

Figure 1:
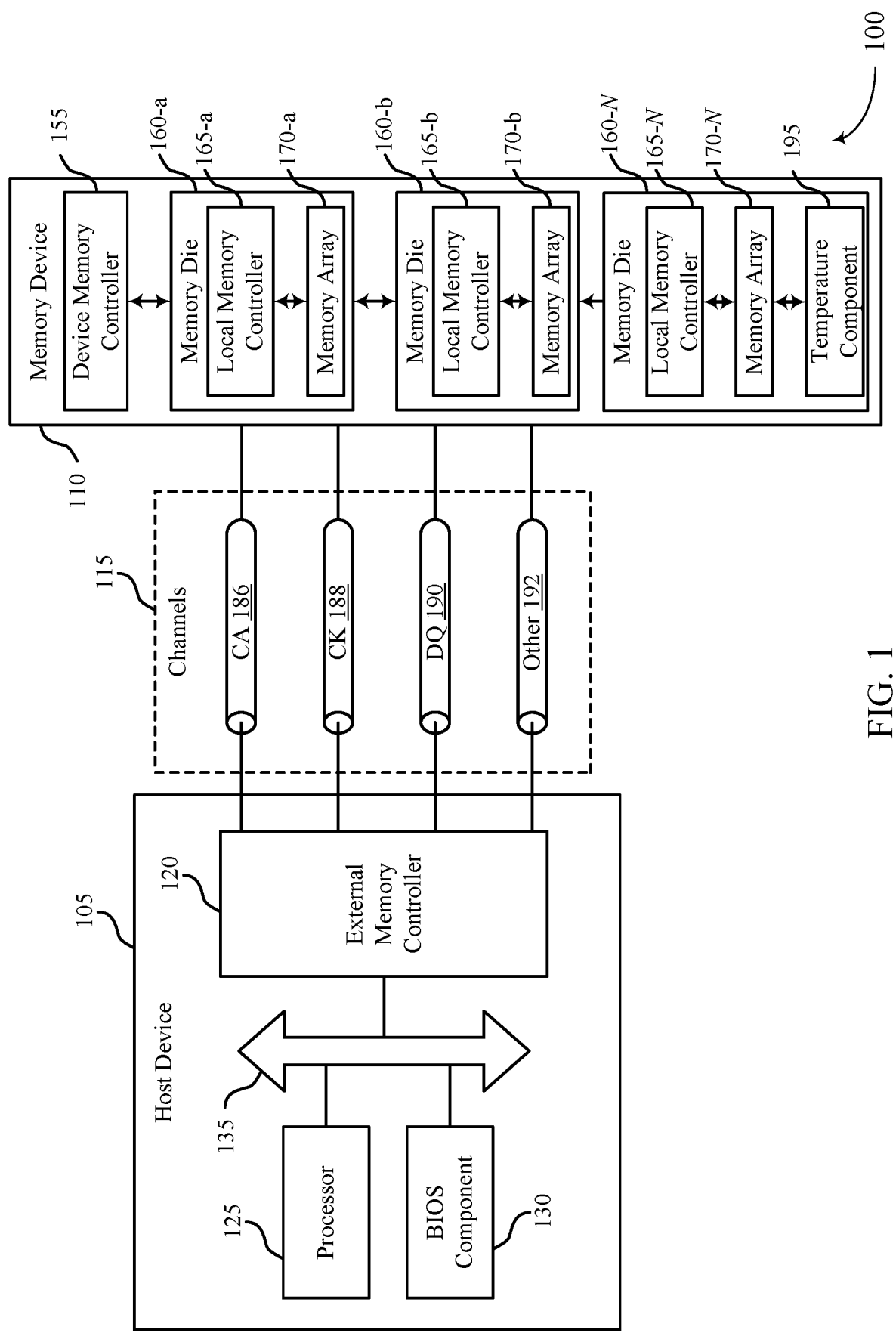
FIG. 1 illustrates an example of a system that supports robust functionality for memory management associated with high-temperature storage and other conditions in accordance with examples as disclosed herein.

Memory devices may experience various conditions when operating as part of electronic devices such as mobile devices, personal computers, wireless communication devices, servers, internet-of-things (IoT) devices, vehicles or vehicle components, etc. In some cases, one or more memory cells of a memory device may become imprinted, which may refer to various conditions where a memory cell of a memory device becomes predisposed toward storing one logic state over one or more other logic states, resistant to being written to a different logic state (e.g., a logic state different than a stored logic state prior to a write operation), or both, among other examples. A likelihood of a memory cell becoming imprinted with a logic state, in some examples, is related to a duration of the memory cell storing a logic state, or a temperature of the memory cell while storing a logic state, or both, among other factors or combinations of factors.

In some examples, a memory device may experience imprinting from being exposed to an elevated temperature (e.g., a temperature over a threshold) over a duration, such as being located in a hot vehicle, located in direct sunlight, or other environments, where such conditions may be referred to as a static bake (e.g., when one or more memory cells are maintained at a particular logic state during the elevated temperature exposure for a duration). In some cases, a static bake may imprint (e.g., thermally imprint) memory cells such that they become biased toward (e.g., stuck in) a first state (e.g., a physical state corresponding to a first logic state) over one or more other states (e.g., a physical state corresponding to a second logic state). In some examples, memory cells may store logic states, for example may be in physical states (e.g., a charge state, a material state) that may be associated with data or may not be associated with data, in an as-manufactured condition. The memory cells may experience some amount of imprinting prior to the memory device being installed in a system or operated in the system, such as an imprinting over time while idle or unpowered, which may cause degraded performance or failures upon initial (or later) operation. In some examples, imprinting may be inadvertently or maliciously caused by operating parameters or access patterns, among other conditions.

Imprinted memory cells may be associated with adverse performance when compared with non-imprinted memory cells. For example, imprinted memory cells may resist charge flow during access operations (e.g., during a read operation, during a write operation), may resist changes in polarization during access operations, may resist changes in material properties such as changes in atomic distribution or arrangement, changes in electrical resistance, or changes in threshold voltage, or may be associated with other behaviors that are different than non-imprinted memory cells (e.g., behaviors that are asymmetric with respect to different logic states). For example, when a write operation is performed on an imprinted memory cell in an effort to write a target logic state, the memory cell may not store the target logic state, or a memory device may be otherwise unable to be read the memory cell as storing the target state (e.g., despite a write operation being performed) despite the write operation, which may result in access errors (e.g., write errors, read errors) or data corruption, among other issues. Although the imprint mechanism may affect different logic states (e.g., a logic state 1 and a logic state 0) of the memory cells in a similar manner (e.g., unable to read or store the logic state), consequences associated with the imprint mechanism (e.g., read-window loss) may be based on a symmetry of a voltage distribution of the memory cell (e.g., a voltage distribution associated with changing polarization from a positive to negative charge or a negative to positive charge). Thus, the amount of performance degradation for imprinted memory cells may be dependent on the logic state (e.g., a polarization state) of the memory cell while experiencing imprinting.

In accordance with examples as disclosed herein, a device may perform one or more memory management procedures (e.g., imprint conditioning procedures or deletion procedures) at a power up of a memory device, at a power down of a memory device, or both, which results in improved conditions for the memory device (e.g., a less susceptible polarization state to imprinting) associated with imprint and imprint recovery. For example, a memory device may apply a pattern (e.g., an imprint conditioning or deletion pattern) to at least a portion (e.g., a subset) of memory cells of a memory array associated with the memory device before, during, or after a power state procedure (e.g., a power up or power down procedure). In some cases, the memory device may determine to perform the memory management procedure based on an indication of (e.g., a command from a host device or automatically upon detecting a trigger associated with) the power state procedure. The memory device may identify (e.g., select) the pattern (e.g., from one or more patterns) based on the determination, where the pattern may be or indicate a data state (e.g., a less susceptible polarization state) for each memory cell of the portion of memory cells. For example, the pattern may indicate a same data state for each memory cell, an alternating data state for each memory cell, or an asymmetric switching pattern over a plurality of cycles (e.g., a logic 0 state for a first duration of time and a logic 1 state for a second duration of time different than the first duration), or any combination thereof. The memory device may write a respective logic value (e.g., a logic 0 or a logic 1) to at least some of the one or more memory cells of the portion of memory cells according to the pattern. In some cases, the memory device may perform the memory management procedure as part of the power state procedure, which results in reducing a possibility of imprint, increasing a possibility of imprint recovery, other advantages, or any combination thereof.

Features of the disclosure are initially described in the context of systems, dies, and memory cell properties with reference to FIGS. 1 through 4. Features of the disclosure are described in the context of memory management techniques with reference to FIG. 5. These and other features of the disclosure are further illustrated by and described with reference to an apparatus diagram and flowcharts that relate to robust functionality for memory management associated with high-temperature storage as described with reference to FIGS. 6-8.

FIG. 1 illustrates an example of a system 100 that supports robust functionality for memory management associated with high-temperature storage in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, (where such "other circuitry" is hereinafter also referred to in the specification and claims as a "processor"), such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, or software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, or discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N), a memory array 170 (e.g., memory array 170-a, memory array 170-b, memory array 170-N), and a temperature component 195 (e.g., a temperature sensor). For example, the temperature component 195 may be operable to determine a temperature of the memory array 170 and communicate the determination to the local memory controller 165, the device memory controller 155, the memory device 110, the host device 105, or any combination thereof. A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155.

In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, or one or more other channels 192, or any combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some cases, one or more memory cells (e.g., of a memory array 170) may experience circumstances that may cause imprinting. A likelihood of a memory cell becoming imprinted with a logic state may be related to a duration of storing a logic state (e.g., a continuous duration, an uninterrupted duration), a temperature of the memory cell while storing a logic state, inadvertent or malicious access patterns, or other factors. Although the imprint mechanism may affect different logic states (e.g., a logic state 1 and a logic state 0) of the memory cells in a similar manner (e.g., unable to read or store the logic state), consequences associated with the imprinting (e.g., a read-window loss) may be based on a symmetry of a voltage distribution of the memory cell (e.g., a voltage distribution associated with changing polarization from a positive to negative charge or a negative to positive charge). Thus, the amount of performance degradation for imprinted memory cells may be dependent on the logic state (e.g., a polarization state) of the memory cell while experiencing conditions causing or influencing imprinting.

In accordance with examples as disclosed herein, a device may perform memory management procedures (e.g., imprint conditioning procedures or deletion procedures) at a power up of a memory device 110, power down of a memory device 110, or both, which results in improved conditions for the memory device 110 (e.g., a less susceptible polarization state to imprinting) associated with imprint and imprint recovery. For example, a memory device 110 may apply a pattern (e.g., an imprint conditioning or deletion pattern) to at least a portion of memory cells of a memory array 170 associated with the memory device 110 before, during, or after a power state procedure (e.g., a power up or power down procedure). In some cases, the memory device 110 may determine to perform the memory management procedure based on an indication of (e.g., a command from a host device 105 or automatically upon detecting a trigger associated with) the power state procedure. The memory device 110 may identify (e.g., select) the pattern based on the determination, where the pattern may indicate a data state (e.g., a less susceptible polarization state) for each memory cell of the portion of memory cells. The memory device 110 may write a respective logic value (e.g., a logic 0 or a logic 1) to at least some (if not all) of the one or more memory cells of the portion of memory cells according to the pattern. In some cases, the memory device 110 may perform the memory management procedure as part of the power state procedure, which results in reducing a likelihood of imprint, increasing a likelihood of imprint recovery, other advantages, or any combination thereof.

Figure 2:
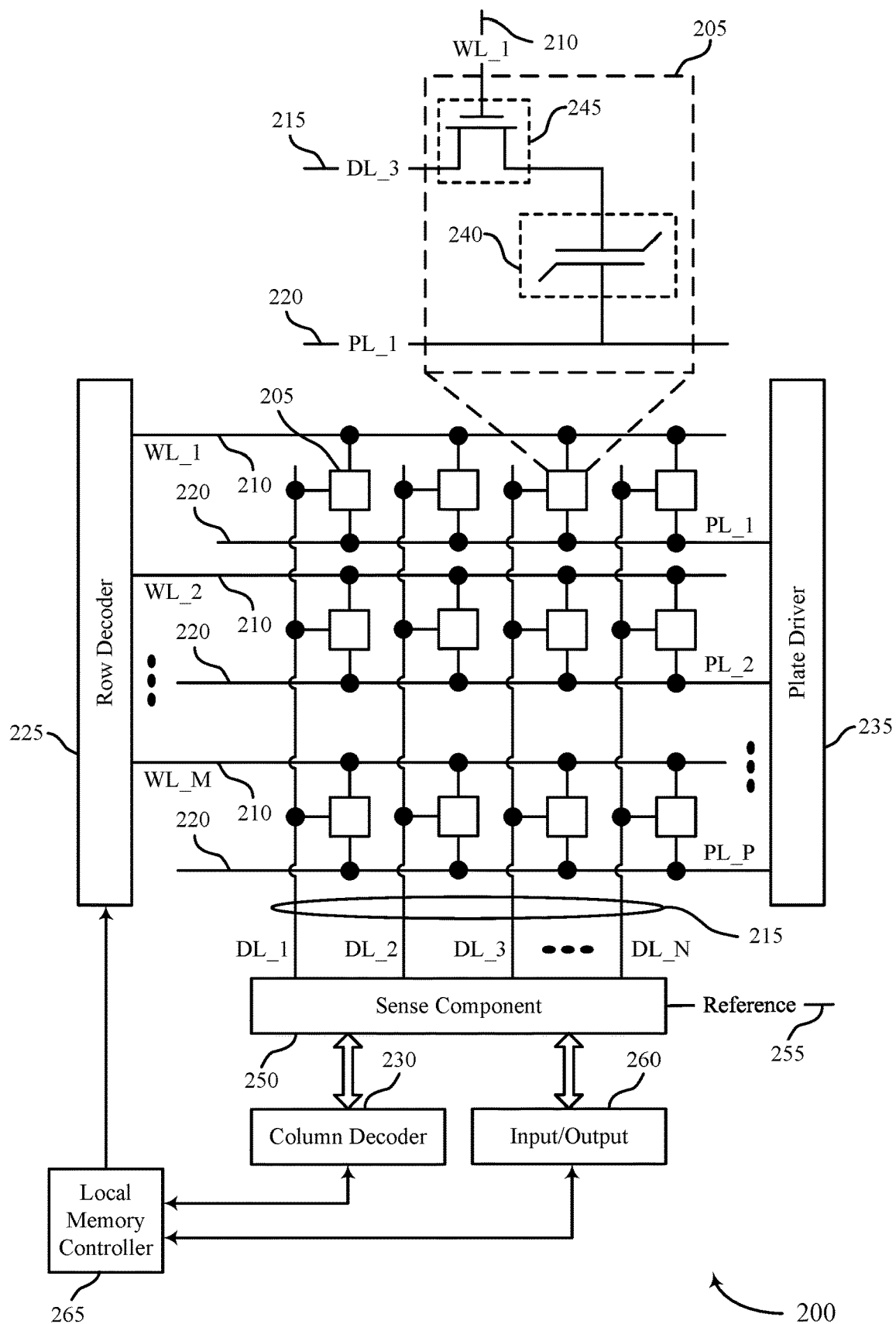
FIG. 2 illustrates an example of a memory die that supports robust functionality for memory management associated with high-temperature storage and other conditions in accordance with examples as disclosed herein.

FIG. 2 illustrates an example of a memory die 200 that supports robust functionality for memory management associated with high-temperature storage in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., a polarization state, a dielectric charge) representative of the programmable states in a capacitor. The memory cell 205 may include a logic storage component, such as capacitor 240, and a switching component 245 (e.g., a cell selection component). A first node of the capacitor 240 may be coupled with the switching component 245 and a second node of the capacitor 240 may be coupled with a plate line 220. The switching component 245 may be an example of a transistor or any other type of switch device that is configurable to establish or de-establish electronic communication between two components. In FeRAM architectures, the memory cell 205 may include a capacitor 240 (e.g., a ferroelectric capacitor) that includes a ferroelectric material to store a charge (e.g., a polarization) representative of the programmable state.

In some other examples, a memory cell 205 may store a logic state using a configurable material, which may be referred to as a memory element, a memory storage element, a material element, a material memory element, a material portion, a polarity-written material portion, and others. A configurable material of a memory cell 205 may have one or more variable and configurable characteristics or properties (e.g., material states) that are representative of (e.g., correspond to) different logic states. For example, a configurable material may take different forms, different atomic configurations, different degrees of crystallinity, different atomic distributions, or otherwise maintain different characteristics. In some examples, such characteristics may be associated with different electrical resistances, different threshold voltages, or other properties that are detectable or distinguishable during a read operation to identify a logic state stored by the configurable material. In some examples, a configurable material may refer to a chalcogenide-based storage component. For example, a chalcogenide storage element may be used in phase change memory (PCM) cells or self-selecting memory cells. Chalcogenide storage elements may be examples of resistive memories or thresholding memories.

The memory die 200 may include access lines (e.g., word lines 210, digit lines 215, plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration (e.g., cross-point memory) may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or any combination thereof. For example, a row decoder 225 may receive a row address from the local memory controller 265 and activate a word line 210 based on the received row address. A column decoder 230 may receive a column address from the local memory controller 265 and activate a digit line 215 based on the received column address. A plate driver 235 may receive a plate address from the local memory controller 265 and activate a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state, a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage, a reference line). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

In some cases, a memory cell configuration may include pairs of memory cells 205 that may be configured to store one bit of information (e.g., sensing the pair of memory cells 205 may sense one bit of information). In such examples, a sense component 255 may be configured to determine a logic state associated with the pair of memory cells 205 based on a difference between a voltage of a first memory cell 205 and a voltage of a second memory cell 205 of the pair of memory cells 205. For example, a logic first memory cell 205 may be programmed to a first logic state and the second memory cell 205 may be programmed to an opposite second logic state and the sense component 255 may determine the logic state associated with the pair of memory cells 205 based on a difference between the first memory cell 205 logic state and the second memory cell 205 logic state.

In some examples, various conditions (e.g., a static bake) may shift or change one or more programmable characteristics of a memory cell 205 (e.g., functional window degradation). For example, the various conditions (e.g., imprint failure mechanisms) may include exposure to high temperatures (e.g., temperatures above a threshold) for a duration (e.g., an extended duration beyond a threshold) or storing a same logic state for a duration (e.g., an extended duration beyond a threshold). Events such as package assembly and solder reflow may be high risk events due to a duration of storage that may occur (e.g., during package assembly) and peak temperatures that may occur (e.g., during solder reflow). Additionally, various modifications to the memory device 110 performed after manufacturing (e.g., performed in the field), such as soldering after component level tests, board assembly rework following a system power up and test (e.g., which may place some bits in a more susceptible data state or subjected to temperature stress), and de-soldering (e.g., as part of a return material authorization (RAM) investigation of a suspected failing component, which can induce damage not associated with the issue and inhibiting accurate diagnostic of the root cause of the field failure), may increase a likelihood of shifting or changing the programmable characteristic of the memory cell 205.

In some examples (e.g., in an FeRAM application), the various conditions may shift or change the polarization capacity, coercivity, or other aspect of charge mobility of the memory cell 205, which may cause the memory cell 205 to become biased toward a specific logic state (e.g., biased toward being written to or read as a logic 1 state, biased toward being written to or read as a logic 0 state). In a memory application using a configurable material (e.g., material memory elements), these or other conditions may cause a variable and configurable characteristic (e.g., property) to resist being changed in response to write operations, such as a resistance to being programmed with a different atomic configuration, a resistance to being programmed with a different degree of crystallinity, a resistance to being programmed with a different atomic distribution, or a resistance to being programmed with some other characteristic associated with a different logic state. Such changes in a programmable characteristic may be referred to as an imprinting, and may cause read or write behavior that is different than when imprinting has not occurred (e.g., asymmetric behavior with respect to logic states). For example, when a write operation, intended to change a logic state of a memory cell 205, is performed on an imprinted memory cell 205 having an initial state, the memory cell 205 may remain in or return to the initial (e.g., imprinted) state, or may be otherwise read as storing the initial state. For example, if a memory cell 205 is imprinted in the 0 logic state, the memory cell 205 may continue to remain in the 0 logic state, or continue to be read as storing the logic 0 state, even after an attempt to or a completed write operation to write the memory cell 205 with a logic 1 state (e.g., after performing a write operation corresponding to the logic 1 state).

In some examples, consequences associated with the imprint mechanism may be different based on a polarization state of the memory cell 205 while experiencing imprinting (e.g., while experiencing static bake). For example, although the imprint mechanism may affect the different polarization states of the memory cell 205 in a similar way, a loss of a read window associated with the memory cell 205 may be different for each polarization state based on an asymmetry of current distributions or voltage distributions of each polarization state. In some cases, the asymmetry may be based on the manufacturing process of the memory cell 205, an electrical property of the memory cell 205, or the manner in which the memory cell 205 is interrogated during a read (e.g., a sense operation performed by a sense component 250, a read technique), other aspects, or any combination thereof, which may intrinsically induce the asymmetry. Because of the difference in the asymmetry of the different polarization states, one state may be more susceptible to imprinting (e.g., damage) than the other state.

In accordance with examples as disclosed herein, components of a memory die 200 (e.g., a local memory controller 265, a row decoder 225, a column decoder 230, a plate driver 235) may be configured to perform memory management procedures (e.g., imprint conditioning procedures or deletion procedures) based on or at a power state procedure of a memory device 110, which results in improved conditions for the memory device 110 (e.g., a less susceptible polarization state to imprinting) associated with imprint and imprint recovery. For example, a memory device 110 may apply a pattern (e.g., an imprint conditioning or deletion pattern) to at least a portion of memory cells 205 of a memory array 170 associated with the memory device 110 before, during, or after the power state procedure (e.g., a power up or power down procedure). In some cases, the memory device 110 may determine to perform the memory management procedure based on an indication (e.g., a command from a host device 105 or automatically upon detecting a trigger associated with) the power state procedure. In some examples, the memory device 110 may select the pattern based on the determination, where the pattern may indicate a data state (e.g., a less susceptible polarization state) for each memory cell 205 (e.g., a ferroelectric capacitor 240) of the portion of memory cells 205. For example, the pattern may indicate a same data state for each memory cell 205, an alternating data state for each memory cell 205, or an asymmetric switching pattern over a plurality of cycles (e.g., a logic 0 state for a first duration of time and a logic 1 state for a second duration of time different than the first duration), one or more other patterns, or any combination thereof. The memory device 110 may write a respective logic value (e.g., a logic 0 or a logic 1) to at least some of the one or more memory cells 205 of the portion of memory cells 205 according to the pattern. In some cases, the memory management procedure results in increased protection against damage from thermal stress, increased protection of memory array functionality during system assembly rework, assistance with RMA investigations by mitigating spurious memory array damage during de-processing, other benefits, or any combination thereof.

Figure 3A:
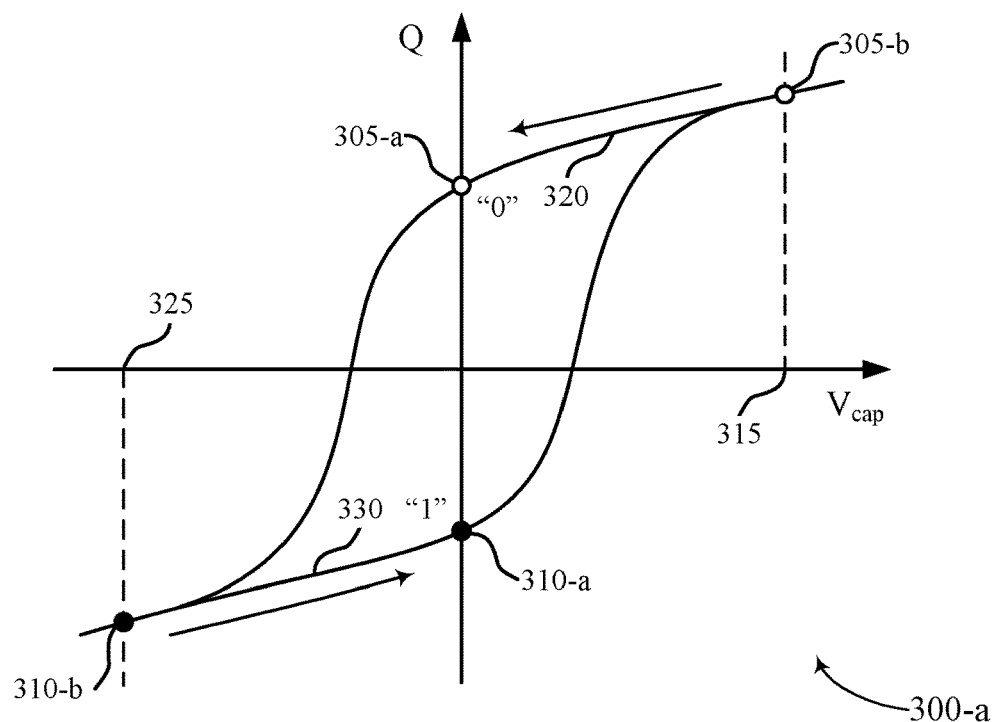
FIGS. 3A and 3B illustrate examples of non-linear electrical properties of a ferroelectric memory cell with hysteresis plots in accordance with examples as disclosed herein.
Figure 3B:
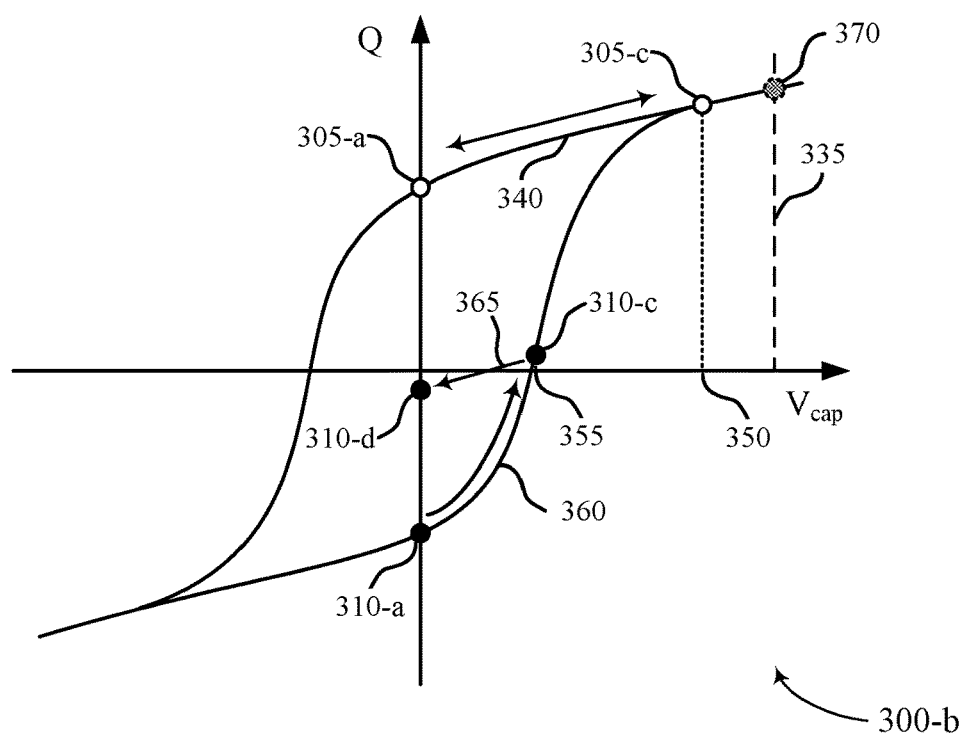

FIGS. 3A and 3B illustrate examples of non-linear electrical properties of a ferroelectric memory cell with hysteresis plots 300-a and 300-b in accordance with examples as disclosed herein. The hysteresis plots 300-a and 300-b may illustrate examples of a writing process and a reading process, respectively, for a memory cell 205 employing a ferroelectric capacitor 240 as described with reference to FIG. 2. The hysteresis plots 300-a and 300-b depict the charge, Q, stored on the ferroelectric capacitor 240 as a function of a voltage difference $V_{cap}$, between the terminals of the ferroelectric capacitor 240 (e.g., when charge is permitted to flow into or out of the ferroelectric capacitor according to the voltage difference $V_{cap}$). For example, the voltage difference $V_{cap}$ may represent the difference in voltage between a plate line side of the capacitor 240 and a digit line side of the capacitor 240 (e.g., a difference between a voltage at a plate node and a voltage at a bottom node, which may be referred to as $V_{plate}-V_{bottom}$, as illustrated in FIG. 2).

A ferroelectric material is characterized by an electric polarization where the material may maintain a non-zero electric charge in the absence of an electric field. Examples of ferroelectric materials include barium titanate ($BaTiO_3$), lead titanate ($PbTiO_3$), lead zirconium titanate (PZT), and strontium bismuth tantalate (SBT). Ferroelectric capacitors 240 described herein may include these or other ferroelectric materials. Electric polarization within a ferroelectric capacitor 240 results in a net charge at the surface of the ferroelectric material, and attracts opposite charge through the terminals of the ferroelectric capacitor 240. Thus, charge may be stored at the interface of the ferroelectric material and the capacitor terminals.

As depicted in the hysteresis plot 300-a, a ferroelectric material used in a ferroelectric capacitor 240 may maintain a positive or negative polarization when there is no net voltage difference between the terminals of the ferroelectric capacitor 240. For example, the hysteresis plot 300-a illustrates two possible polarization states, a charge state 305-a and a charge state 310-a, which may represent a negatively saturated polarization state and a positively saturated polarization state, respectively. The charge states 305-a and 310-a may be at a physical condition illustrating remnant polarization (Pr) values, which may refer to the polarization or charge that remains upon removing the external bias (e.g., voltage). According to the example of the hysteresis plot 300-a, the charge state 305-a may represent a logic 0 when no voltage difference is applied across the ferroelectric capacitor 240, and the charge state 310-a may represent a logic 1 when no voltage difference is applied across the ferroelectric capacitor 240. In some examples, the logic values of the respective charge states or polarization states may be reversed or interpreted in an opposite manner to accommodate other schemes for operating a memory cell 205.

A logic 0 or 1 may be written to the memory cell by controlling the electric polarization of the ferroelectric material, and thus the charge on the capacitor terminals, by applying a net voltage difference across the ferroelectric capacitor 240. For example, the voltage 315 may be a voltage equal to or greater than a positive saturation voltage, and applying the voltage 315 across the ferroelectric capacitor 240 may result in charge accumulation until the charge state 305-*b* is reached (e.g., writing a logic 0). Upon removing the voltage 315 from the ferroelectric capacitor 240 (e.g., applying a zero net voltage across the terminals of the ferroelectric capacitor 240), the charge state of the ferroelectric capacitor 240 may follow the path 320 shown between the charge state 305-*b* and the charge state 305-*a* at zero voltage across the capacitor. In other words, charge state 305-*a* may represent a logic 0 state at an equalized voltage across a ferroelectric capacitor 240 that has been positively saturated.

Similarly, voltage 325 may be a voltage equal to or lesser than a negative saturation voltage, and applying the voltage 325 across the ferroelectric capacitor 240 may result in charge accumulation until the charge state 310-*b* is reached (e.g., writing a logic 0). Upon removing the voltage 325 from the ferroelectric capacitor 240 (e.g., applying a zero net voltage across the terminals of the ferroelectric capacitor 240), the charge state of the ferroelectric capacitor 240 may follow the path 330 shown between the charge state 310-*b* and the charge state 310-*a* at zero voltage across the capacitor. In other words, charge state 310-*a* may represent a logic 0 state at an equalized voltage across a ferroelectric capacitor 240 that has been negatively saturated. In some examples, the voltage 315 and the voltage 325, representing saturation voltages, may have the same magnitude, but opposite polarity across the ferroelectric capacitor 240. Although the example of hysteresis plot 300-*a* illustrates a logic 0 corresponding to charge state 310-*a*, and a logic 1 corresponding to charge state 305-*a*, logic states may correspond to different charge states in some examples, such as a logic 0 corresponding to charge state 305-*a* and a logic 1 corresponding to charge state 310-*a*, among other examples.

To read, or sense, the stored state of a ferroelectric capacitor 240, a voltage may also be applied across the ferroelectric capacitor 240. In response to the applied voltage, the subsequent charge Q stored by the ferroelectric capacitor changes, and the degree of the change may depend on the initial polarization state, the applied voltages, intrinsic or other capacitance on access lines, and other factors. In other words, the charge state or access line voltage resulting from a read operation may depend on whether the charge state 305-*a*, or the charge state 310-*a*, or some other charge state was initially stored, among other factors.

The hysteresis plot 300-*b* illustrates examples of access operations for reading stored charge states (e.g., charge states 305-*a* and 310-*a*). In some examples, a read voltage 335 may be applied, for example, as a voltage difference via a plate line 220 and a digit line 215 as described with reference to FIG. 2. The hysteresis plot 300-*b* may illustrate read operations where the read voltage 335 is positive voltage difference $V_{cap}$ (e.g., where $V_{plate}-V_{bottom}$ is positive). A positive read voltage across the ferroelectric capacitor 240 may be referred to as a "plate high" read operation, where a plate line 220 is taken initially to a high voltage, and a digit line 215 is initially at a low voltage (e.g., a ground voltage). Although the read voltage 335 is shown as a positive voltage across the ferroelectric capacitor 240, in alternative access operations a read voltage may be a negative voltage across the ferroelectric capacitor 240, which may be referred to as a "plate low" read operation.

The read voltage 335 may be applied across the ferroelectric capacitor 240 while a memory cell 205 is selected (e.g., by activating a switching component 245 via a word line 210 as described with reference to FIG. 2). Upon applying the read voltage 335 to the ferroelectric capacitor 240, charge may flow into or out of the ferroelectric capacitor 240 via the associated digit line 215 and plate line 220, and, in some examples, different charge states or access line voltages may result depending on whether the ferroelectric capacitor 240 was at the charge state 305-*a* (e.g., a logic 0) or at the charge state 310-*a* (e.g., a logic 1), or some other charge state.

When performing a read operation on a ferroelectric capacitor 240 at the charge state 305-*a* (e.g., a logic 0), additional positive charge may accumulate across the ferroelectric capacitor 240, and the charge state may follow path 340 until reaching the charge and voltage of the charge state 305-*c*. The amount of charge flowing through the capacitor 240 may be related to the intrinsic or other capacitance of a digit line 215 (e.g., intrinsic capacitance of the digit line 215, capacitance of a capacitor or capacitive element coupled with the digit line 215, or a combination thereof), or other access line (e.g., a signal line opposite an amplifier, such as a charge transfer sensing amplifier, from a digit line 215). In a "plate high" read configuration, a read operation associated with the charge states 305-*a* and 305-*c*, or more generally a read operation associated with the logic 0 state, may be associated with a relatively small amount of charge transfer (e.g., compared to a read operation associated with the charge states 310-*a* and 310-*c*, or more generally, compared to reading the logic 1 state).

As shown by the transition between the charge state 305-*a* and the charge state 305-*c*, the resulting voltage 350 across the ferroelectric capacitor 240 may be a relatively large positive value due to the relatively large change in voltage at the capacitor 240 for the given change in charge. Thus, upon reading a logic 0 in a "plate high" read operation, the digit line voltage, equal to the difference of a plate line voltage, $V_{PL}$, and $V_{cap}$ (e.g., $V_{plate}-V_{bottom}$) at the charge state 310-*c*, may be a relatively low voltage. Such a read operation may not change the remnant polarization of the ferroelectric capacitor 240 that stored the charge state 305-*a* and thus, after performing the read operation, the ferroelectric capacitor 240 may return to the charge state 305-*a* via path 340 when the read voltage 335 is removed (e.g., by applying a zero net voltage across the ferroelectric capacitor 240, by equalizing the voltage across the ferroelectric capacitor 240). Thus, performing a read operation with a positive read voltage on a ferroelectric capacitor 240 with a charge state 305-*a* may be considered a non-destructive read process. In some cases, a rewrite operation may not be involved or may be omitted in such scenarios.

When performing the read operation on the ferroelectric capacitor 240 at the charge state 310-*a* (e.g., a logic 1), the stored charge may reverse polarity or may not reverse polarity as a net positive charge accumulates across the ferroelectric capacitor 240, and the charge state may follow the path 360 until reaching the charge and voltage of the charge state 310-*c*. The amount of charge flowing through the ferroelectric capacitor 240 may again be related to the intrinsic or other capacitance of the digit line 215. In a "plate high" read configuration, a read operation associated with the charge states 310-*a* and 310-*c*, or more generally a read operation associated with the logic 1 state, may be associated with a relatively large amount of charge transfer, or a relatively smaller capacitor voltage, $V_{cap}$ (e.g., compared to a read operation associated with the charge states 305-*a* and 305-*c*, or more generally, compared to reading the logic 0 state).

As shown by the transition between the charge state 310-*a* and the charge state 310-*c*, the resulting voltage 355 may, in some cases, be a relatively small positive value due to the relatively small change in voltage at the capacitor 240 for the given change in charge. Thus, upon reading a logic 1 in a "plate high" read operation, the digit line voltage, equal to the difference of a plate line voltage, $V_{PL}$, and $V_{cap}$ (e.g., $V_{plate}-V_{bottom}$) at the charge state 310-c, may be a relatively high voltage.

The transition from the charge state 310-a to the charge state 310-c may be illustrative of a sensing operation that is associated with a partial reduction or partial reversal in polarization or charge of a ferroelectric capacitor 240 of a memory cell 205 (e.g., a reduction in the magnitude of charge Q from the charge state 310-a to a charge state 310-d). In other words, according to the properties of the ferroelectric material, after performing the read operation the ferroelectric capacitor 240 may not return to the charge state 310-a when the read voltage 335 is removed (e.g., by applying a zero net voltage across the ferroelectric capacitor 240, by equalizing the voltage across the ferroelectric capacitor 240). Rather, when applying a zero net voltage across the ferroelectric capacitor 240 after a read operation of the charge state 310-a with read voltage 335, the charge state may follow path 365 from the charge state 310-c to the charge state 310-d, illustrating a net reduction in polarization magnitude (e.g., a less negatively polarized charge state than initial charge state 310-a, illustrated by the difference in charge between the charge state 310-a and the charge state 310-d). Thus, performing a read operation with a positive read voltage on a ferroelectric capacitor 240 with a charge state 310-a may be described as a destructive read process.

In some cases, a rewrite operation (e.g., applying a voltage 325) may be performed after performing such a read operation, which may cause the memory cell to transition from the charge state 310-d to the charge state 310-a (e.g., indirectly, such as via a charge state 310-b). In various examples, such a rewrite operation may be performed after any read operation, or may be performed based on some circumstances (e.g., when a read voltage is opposite from the write voltage associated with a detected logic state). However, in some sensing schemes, a reduced remnant polarization may still be read as the same stored logic state as a saturated remnant polarization state (e.g., supporting detection of a logic 1 from both the charge state 310-a and the charge state 310-d), thereby providing a degree of non-volatility for a memory cell 205 with respect to read operations.

In other examples (e.g., when a ferroelectric material is able to maintain polarization in the presence of at least some level of a depolarizing field, when a ferroelectric material has sufficient coercivity, not shown), after performing a read operation the ferroelectric capacitor 240 may return to the charge state 310-a when a read voltage is removed, and performing such a read operation with a positive read voltage on a ferroelectric capacitor 240 with a charge state 310-a may be described as a non-destructive read process. In such cases, rewrite operations may not be expected after such a read operation.

The position of the charge state 305-c and the charge state 310-c after initiating a read operation may depend on various factors, including the specific sensing scheme and circuitry. In some cases, the charge associated with a read operation may depend on the net capacitance of the digit line 215 coupled with the memory cell 205, which may include an intrinsic capacitance, integrator capacitors, and others. For example, if a ferroelectric capacitor 240 is electrically coupled with a digit line 215 initially at 0V and the read voltage 335 is applied to a plate line 220, the voltage of the digit line 215 may rise when the memory cell 205 is selected due to charge flowing from the ferroelectric capacitor 240 to the net capacitance of the digit line 215. Thus, in some examples, a voltage measured at a sense component 250 may not be equal to the read voltage 335, or the resulting voltages 350 or 355, and instead may depend on the voltage of the digit line 215 following a period of charge sharing.

The initial state (e.g., charge state, logic state) of the ferroelectric capacitor 240 may be determined by comparing the voltage of a digit line 215, or signal line, where applicable, resulting from the read operation with a reference voltage (e.g., a reference 255). In some examples, the digit line voltage may be the difference between the read voltage 335 and the final voltage across the capacitor 240 (e.g., (read voltage 335-voltage 350) when reading the ferroelectric capacitor 240 having a stored charge state 305-a, (read voltage 335-voltage 355) when reading the ferroelectric capacitor 240 having a stored charge state 310-a). In some examples, the digit line voltage may be the sum of the plate line voltage and the final voltage across the ferroelectric capacitor 240 (e.g., voltage 350 when reading the ferroelectric capacitor 240 having a stored charge state 305-a, or voltage 355 when reading the ferroelectric capacitor 240 having a stored charge state 310-a).

In some examples, read operations of a memory cell 205 may be associated with a fixed voltage of a digit line 215, where a charge state of a ferroelectric capacitor 240 after initiating a read operation may be the same regardless of its initial charge state. For example, in a read operation where a digit line 215 and plate line 220 are held at a fixed relative voltage that supports the read voltage 335, the ferroelectric capacitor 240 may proceed to a charge state 370 for both the case where the ferroelectric capacitor initially stored a charge state 305-a and the case where the ferroelectric capacitor initially stored a charge state 310-a. Accordingly, rather than using a difference in voltage (e.g., of a digit line 215) to detect an initial charge state or logic state, in some examples, the initial charge state or logic state of the ferroelectric capacitor 240 may be determined based at least in part on the difference in charge associated with the read operation. For example, as illustrated by hysteresis plot 300-b, a logic 0 may be detected based on difference in charge, Q, between charge state 305-a and charge state 370 (e.g., a relatively small amount of charge transfer), and a logic 1 may be detected based on a difference in charge, Q, between charge state 310-a and charge state 370 (e.g., a relatively large amount of charge transfer).

In some examples, such a detection may be supported by a charge-transfer sensing amplifier, a cascode (e.g., a transistor configured in a cascode arrangement), or other signal development circuitry between a digit line 215 and a signal line that is coupled with a sense amplifier, where a voltage of the signal line may be based at least in part on the amount of charge transfer of a capacitor 240 after initiating a read operation (e.g., where the described charge transfer may correspond to an amount of charge that passes through the charge-transfer sensing amplifier, cascode, or other signal development circuitry). In such examples, the voltage of the signal line may be compared with a reference voltage (e.g., at a sense component 250) to determine the logic state initially stored by the ferroelectric capacitor 240, despite the digit line 215 being held at a fixed voltage level.

In some examples, if a digit line 215 is held at a fixed read voltage 335, a capacitor 240 may be positively saturated after a read operation irrespective of whether the capacitor 240 was initially at a charge state 305-a (e.g., a logic 0) or initially at a charge state 310-a (e.g., a logic 1). Accordingly, after such a read operation, the capacitor 240 may, at least temporarily, be charged or polarized according to a logic 0 state irrespective of its initial or intended logic state. Thus, a rewrite operation may be expected at least when the capacitor 240 is intended to store a logic 1 state, where such a rewrite operation may include applying a write voltage 325 to store a logic 1 state as described with reference to hysteresis plot 300-a. Such rewrite operations may be configured or otherwise described as a selective rewrite operation, since a rewrite voltage may not be applied when the capacitor 240 is intended to store a logic 0 state. In some examples, such an access scheme may be referred to as a "2Pr" scheme, where the difference in charge for distinguishing a logic 0 from a logic 1 may be equal to two times the remnant polarization of a memory cell 205 (e.g., a difference in charge between charge state 305-a, a positively saturated charge state, and charge state 310-a, a negatively saturated charge state).

The examples of hysteresis plots 300-a and 300-b may be illustrative of normalized (e.g., equalized) behavior of a memory cell 205 including a ferroelectric capacitor 240 when subjected to write biasing or read biasing. However, based on various operating or environmental conditions, ferroelectric capacitors 240 may become imprinted with or toward a particular logic state, which may refer to various conditions where a ferroelectric capacitor 240 (or other component or combination of various components) becomes predisposed toward storing one logic state over another, resistant to being written to a different logic state (e.g., a logic state different than a stored logic state prior to a write operation), or both, among other examples. For example, as compared with the hysteresis plots 300-a and 300-b, an imprinted ferroelectric capacitor 240 may be associated with a different (e.g., a higher coercivity or shifted coercivity with respect to changing or inverting a polarization state), a reduced saturation polarization, a shallower slope of polarization, or other characteristics that may be different (e.g., asymmetric) with respect to different logic states. Memory arrays having imprinted ferroelectric capacitors 240 may be associated with read errors, write errors, or other behaviors that can impair operations of a memory device, or a system that includes a memory device. In accordance with examples as disclosed herein, a likelihood of imprinting ferroelectric capacitors 240 may be reduced by applying various imprint conditioning patterns to memory cells of the memory arrays before or after a power state procedure, where the patterns may condition (e.g., precondition the memory in a state that is more robust to relatively extreme thermal processes) the memory arrays before an event with high likelihood of imprint (e.g., rework, de-soldering, among other examples).

Figure 4:
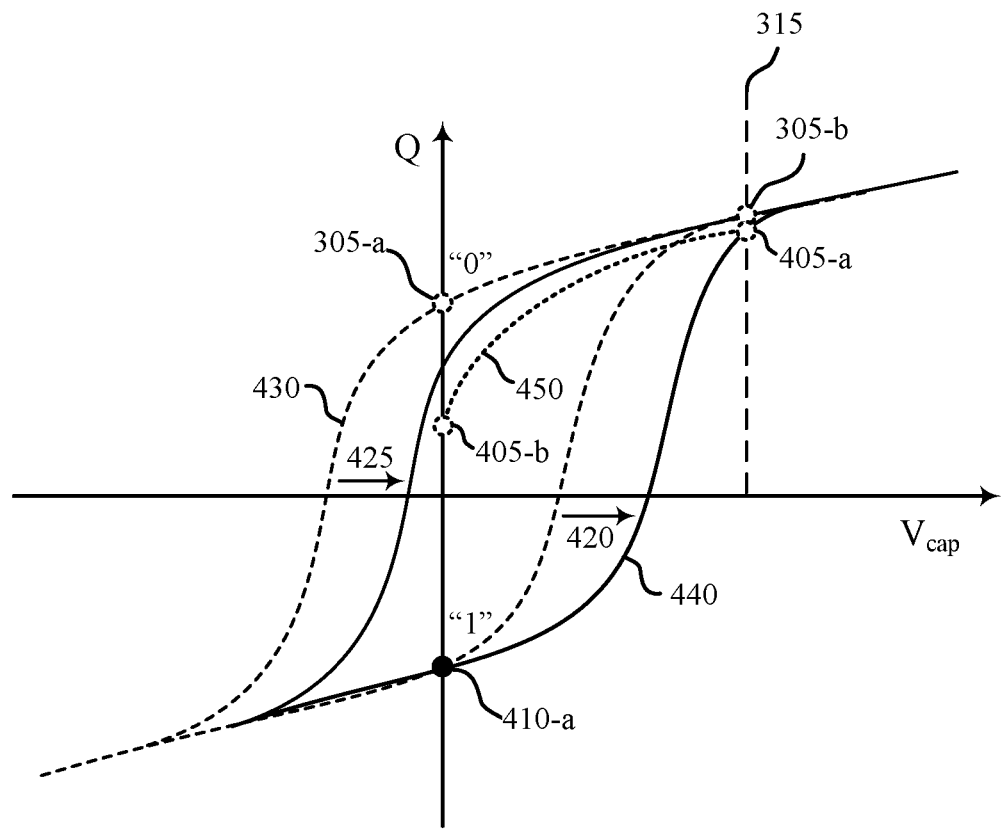
FIG. 4 illustrates an example of non-linear electrical properties of imprinted ferroelectric memory cells with a hysteresis plot in accordance with examples as disclosed herein.

FIG. 4 illustrates an example of non-linear electrical properties of imprinted ferroelectric memory cells with a hysteresis plot 400 in accordance with examples as disclosed herein. For example, the hysteresis plot 400 illustrates an example of characteristics of a ferroelectric capacitor 240 that may shift as a result of imprinting with a state (e.g., an imprinting with a logic 1, an imprinting with a charge state 410-a, which may be equal to the charge state 310-a or different than the charge state 310-a described for example with reference to FIGS. 3A and 3B), which may be related to an alteration of configuration of electrostatic domains in a ferroelectric memory cell 205. The shifted characteristics of the hysteresis plot 400, illustrated by imprinted hysteresis curve 440, may result from conditions during which a ferroelectric capacitor 240 has maintained a charge state for a relatively long duration, or maintained a charge state under relatively high temperature conditions, or both (e.g., under static bake conditions), among other conditions associated with memory cell imprint.

In some cases, the hysteresis plot 400 may be an example of a shift from an unimprinted hysteresis curve 430 to an imprinted hysteresis curve 440, which may be associated with various shifts in coercivity of a ferroelectric capacitor 240, among other aspects. For example, a ferroelectric capacitor 240 may experience a shift 420 (associated with a shift in coercive voltage to change from an imprinted polarization state such as an increase in coercive voltage magnitude), or a shift 425 (associated with a shift in coercive voltage to return to an imprinted polarization state such as a decrease in coercive voltage magnitude), or both, in which case a shift 420 and a shift 425 may be associated with a same or similar amount of shift (e.g., along the voltage axis) or different amounts of shift compared to each other. A shift to the imprinted hysteresis curve 440 may be associated with an increased resistance (e.g., an asymmetric resistance) to changing polarization during, for example, a write operation (e.g., associated with applying a voltage 315) or during a read operation (e.g., associated with applying a read voltage 335), such as a collective increase of resistance of domains from changing polarization state (e.g., where domains are able to have their polarization reversed, but where such a reversal collectively expects a relatively higher voltage bias).

For example, according to the hysteresis plot 400, when an imprinted ferroelectric capacitor 240 storing a charge state 410-a is biased with a voltage 315 (e.g., a write voltage associated with writing a logic 0), charge may accumulate until the charge state 405-a is reached. Compared with the charge state 305-b, which may correspond to a saturated condition of a normalized ferroelectric capacitor 240 (e.g., in accordance with the unimprinted hysteresis curve 430, where polarization of the ferroelectric capacitor may be fully reversed at the voltage 315), the charge state 405-a may not correspond to a saturated condition, and instead may illustrate an example of a partial polarization reversal in response to the write voltage 315. Such a response may be associated with the shift 420, corresponding to a change of the coercive voltage associated with positively saturating the ferroelectric capacitor 240, in which case the voltage 315 may not have a high enough magnitude to positively saturate the negatively imprinted ferroelectric capacitor 240.

Additionally, or alternatively, removing the voltage 315 from the ferroelectric capacitor 240 (e.g., applying a zero net voltage across the terminals of the ferroelectric capacitor 240 after applying the voltage 315) may be associated with a reduction in polarization relative to the charge state 405-a, such as during conditions in which a degree of imprinting may prevent domains (e.g., charge domains) from remaining in a written state. For example, when the voltage 315 is removed from the ferroelectric capacitor 240, the charge state of the ferroelectric capacitor 240 may follow the path 450 shown between the charge state 405-a and the charge state 405-b at zero voltage across the ferroelectric capacitor 240. In various examples, the charge state 405-b may have a lower charge than the charge state 305-a (e.g., a charge state of an unimprinted ferroelectric capacitor 240 corresponding to a logic 0 at an equalized voltage across the ferroelectric capacitor). Moreover, in some examples, the path 450 may include at least some loss of polarization (e.g., returning towards an imprinted charge state or polarization state when a write bias is removed), which may be referred to as backswitching, drop, or recoil. Such a response may be associated with the shift 425, corresponding to a change of the coercive voltage associated with negatively saturating the ferroelectric capacitor 240 (e.g., or losing a positive polarization), in which case the ferroelectric capacitor 240 may be unable to maintain at least some magnitude of positive polarization at an equalized voltage (e.g., unable to maintain a positive polarization associated with applying a voltage 315, including a relatively lower positive polarization associated with the charge state 405-a).

Although the hysteresis plot 400 illustrates the charge state 405-b as having a net charge, Q, that is positive, under various circumstances (e.g., various imprint severity, various degrees of coercivity shift, various degrees of polarization reversal among a set of domains of a ferroelectric capacitor 240), a net charge of a charge state 405-b may have a positive value or a negative value. Under various circumstances, the charge state 405-b may be illustrative of storing a logic 0 or a logic 1, or may be illustrative of a charge state that may be read by a memory device as storing a logic 0 or a logic 1, or may be considered as an indeterminate state. In other words, as a result of the shift from the unimprinted hysteresis curve 430 to the imprinted hysteresis curve 440, applying the voltage 315 to an imprinted memory cell 205 may not successfully write a logic 0 to a ferroelectric capacitor 240 imprinted with a logic 1, or may not support the ferroelectric capacitor 240 being successfully read as a logic 0, or both.

Although the hysteresis plot 400 illustrates simplified examples of mechanisms that may be related to imprinting in a ferroelectric capacitor 240, other mechanisms or conditions, or combinations thereof, may be associated with memory cell imprint. For example, a memory cell (e.g., a memory cell 205) imprinted with a logic 1 may not be associated with a charge state 310-a as described with reference to FIGS. 3A and 3B, and may have a different charge state 410-a after imprinting (e.g., due to charge degradation during imprint, due to saturation polarization collapse of an imprinted logic state or charge state during imprint itself, due to charge leakage, or due to a change in saturation polarization that may change or reduce a charge state 410-a when rewritten with a logic 1 state, or any combination thereof). In another example, imprint may change (e.g., widen) a distribution of polarization reversal voltages across a set of domains in a ferroelectric capacitor 240, which may be associated with a shallower slope of Q versus $V_{cap}$ between one polarization state and another (e.g., across a polarization reversal region, in a region associated with a coercive voltage), which may be accompanied by a collective shift in coercivity or a change in polarization reversal capacity, among other aspects. In some examples, imprinting in a ferroelectric capacitor 240 may also be associated with other phenomena, or various combinations of these and other phenomena.

Although some aspects of memory cell imprint are described with reference to ferroelectric memory applications (e.g., FeRAM applications), imprint management in accordance with the present disclosure is also applicable to other memory technologies that undergo drift or other shifts in characteristics that may be asymmetric with respect to different logic states. For example, material memory elements, such as phase change, resistive, or thresholding memories (among others) may undergo material segregation or immobilization as a result of memory cell imprint (e.g., as a result of storing a logic state over a duration, as a result of storing a logic state at an elevated temperature), where such effects may be associated with (e.g., asymmetrically associated with, drift towards) storing or reading a particular logic state over another. In some examples, memory cells 205 in such applications that are imprinted may be associated with an increased resistance to changing from one configurable material property or characteristic to another, which may correspond to such phenomena as a relatively greater resistance to changes from one threshold voltage to another, a relatively greater resistance to changes from one electrical resistance to another, and other characteristics. In various examples, a memory management procedure in accordance with examples as disclosed herein, may reduce a susceptibility of memory cells to form characteristics of material memory elements associated with imprint.

Figure 5A:
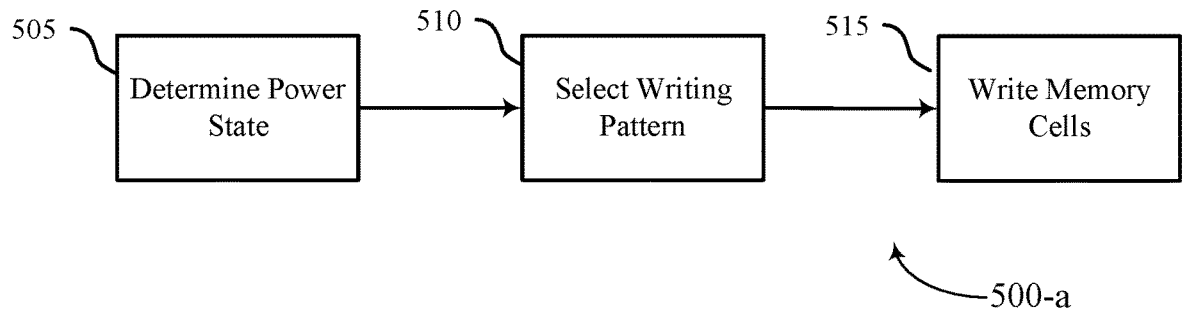
FIGS. 5A, 5B, and 5C illustrate examples of process flows that support robust functionality for memory management associated with high-temperature storage and other conditions in accordance with examples as disclosed herein.
Figure 5B:
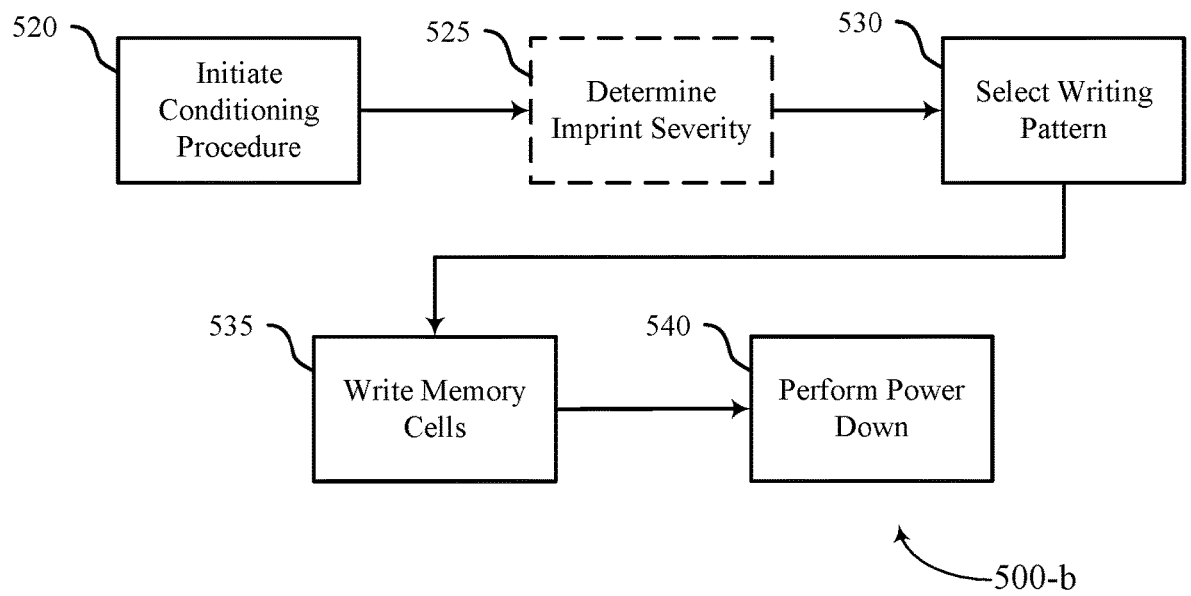
Figure 5C:
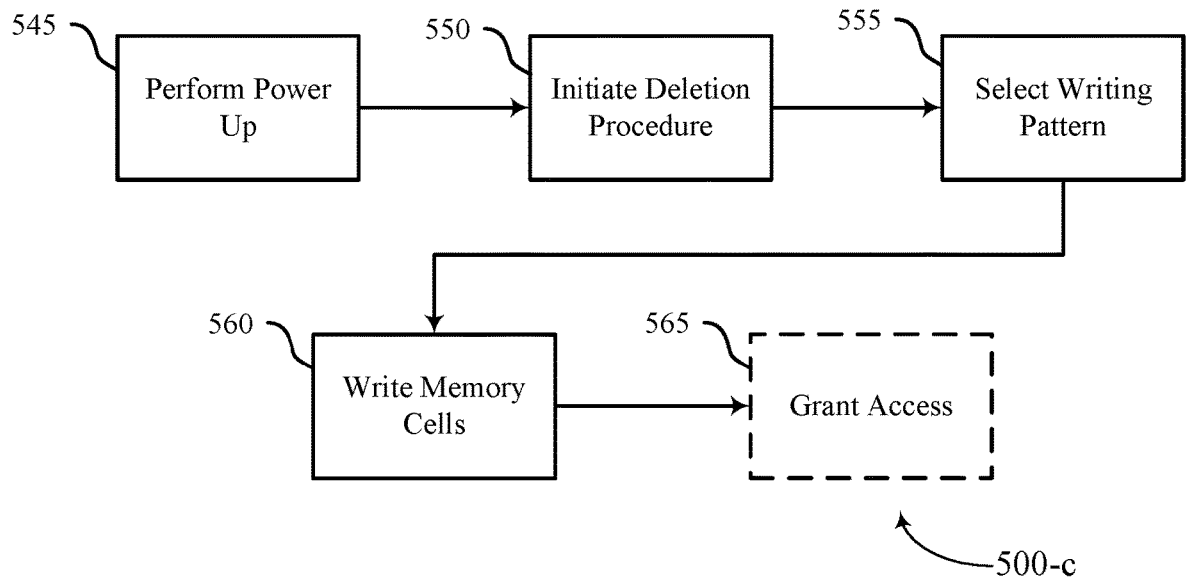

FIGS. 5A, 5B, and 5C illustrate examples of process flows 500-a, 500-b, and 500-c respectively, that support robust functionality for memory management associated with high-temperature storage in accordance with examples as disclosed herein. The process flows 500-a, 500-b, and 500-c each illustrate examples of memory management procedures (e.g., an imprint conditioning procedure, a deletion procedure) in accordance with writing patterns (e.g., imprint conditioning patterns, deletion patterns) that may be implemented by a memory device 110 (e.g., a memory die 200) before, during, or after a power state procedure. In various examples, a memory device 110 (e.g., a device memory controller 155, a local memory controller 165, or a local memory controller 265, or any combination thereof, among other examples) may determine to perform such a management procedure (e.g., automatically upon detecting a trigger associated with a power state procedure, automatically upon detecting a power up, automatically upon detecting a power down, before an event with a likelihood of imprinting), or the memory device 110 may perform such a management procedure in response to an indication (e.g., a command) from a host device 105 (e.g., a command transmitted in response to operating conditions detected by the host device 105 or detected by the memory device 110 and otherwise conveyed to the host device 105, prior to performing a procedure with a likelihood of imprinting (e.g., prior to rework or de-soldering)). In some cases, the condition (e.g., the trigger) for automatically determining to perform the management procedure may be a signal or a measurement indicating a temperature (e.g., a temperature component 195 indicating a temperature above a threshold temperature), a signal to initiate the power state procedure, or changing a value of a register to indicate the management procedure, or any combination thereof, among other examples.

In some cases, one or more memory cells 205 of a memory array 170 may experience circumstances that may cause imprinting. Although imprinting may affect different logic states of the memory cells 205 in a similar manner, consequences associated with a severity of imprinting may be based on symmetry (e.g., asymmetry) of a voltage or current distribution of the memory cell 205 when changing polarization (e.g., changing from a first polarity to a second polarity different than the first). As such, a first polarity of the memory cell 205 (e.g., a logic state of the memory cell 205) may be more robust (e.g., less susceptible) against imprinting than a second polarity of the memory cell 205. In some examples, the polarity (e.g., positive or negative polarity) associated with robustness against imprinting may change based on various causes of asymmetry (e.g., a manufacturing process, an electrical property, a read technique). In some cases, a memory device 110 (e.g., the device memory controller 155, the local memory controller 165, or the local memory controller 265, or any combination thereof) may apply a writing pattern to the memory cells 205 such that the memory cells 205 may be written to a logic state that corresponds to a more robust polarity against imprinting.

The process flow 500-a may illustrate a first implementation of the management procedure. For example, the process flow 500-a may include a method performed by a memory device 110 including, determining a power state (e.g., a power down or power up state), identifying (e.g., selecting) a writing pattern (e.g., an imprint conditioning pattern, or a deletion pattern, or both, among other examples), and writing memory cells 205 with a logic value. In the example of FIG. 5A, the memory device (e.g., the memory device 110) may determine to apply the writing pattern based on an indication of a power state of the memory device 110. For example, at 505, the memory device 110 may determine the indication of the power state (e.g., an indication of a power up or a power down). In some cases, the indication may be a command from a host device 105 to perform a power state procedure, to perform the management procedure, or a trigger (e.g., a signal or a duration of active or idle time, among other examples) associated with the power state. In some examples, the memory device may receive the indication (e.g., a command or signal) or determine a number of cycles (e.g., clock cycles) that have occurred. In some implementations, the power state may be indicative of or associated with a possible imprinting event. For example, the power down may be associated with preparing the memory device 110 for modifications (e.g., soldering or de-soldering) or storage (e.g., storing the memory device 110 for a duration or at temperatures conducive of imprinting). Although the example of a power state is depicted, the determination to apply the writing pattern may be based on other examples of possible imprinting events or as a mechanism of safety protocols (e.g., applying the writing pattern regardless of and independent of an indication of a likelihood of imprint) without a prior indication.

At 510, the memory device 110 may optionally select a writing pattern. In some examples, the writing pattern may include an indication of a data state (e.g., a logic 1 state or a logic 0 state) for at least some of the memory cells 205 of the memory array 170. For example, the memory device 110 may determine to select a writing pattern that includes a portion of the memory array 170 based on power constraints, command execution time constraints, or both, associated with the writing pattern. For example, the management procedure may be constrained to complete writing the writing pattern within a threshold duration or using a threshold power. To comply with the threshold duration, the writing pattern may be reduced in complexity or constrained to a portion of the memory array 170 (e.g., a relatively simple pattern of same logic values or covering only a portion of the memory array 170, among other examples). In other examples, the writing pattern may indicate the data state for each memory cell of the memory device 110 (e.g., the writing pattern itself may indicate the data state for each memory cell of the memory device 110, the writing pattern may indicate the data state for each memory cell of the memory device 110 in some sort of relationship such as an alternating relationship of various cells or a grouped mapping or other examples). In further examples, the writing pattern may indicate a respective data state for portions of the memory device 110 (e.g., the writing pattern may indicate a data state per memory array 170).

At 515, the memory device 110 may write a respective logic value to at least one of the memory cells 205 in accordance with the writing pattern based on the power state procedure. For example, the memory device 110 may write the respective logic value to each of the memory cells associated with the memory device 110. In some other examples, the memory device may write the respective logic value to the memory cells 205 that are of a different logic value than the respective logic value. For example, the logic value of a memory cell 205 may be a same logic value as the respective logic value indicated by the writing pattern. As such, the memory device 110 may skip (e.g., refrain from) writing the respective logic value to the memory cell 205 (e.g., as the memory cell 205 is already in the robust state).

In some scenarios, the power and duration constraints may inhibit writing the respective logic values. For example, the power state procedure may include one or more constraints as part of the procedure. If the writing procedure approaches, hits, or otherwise overcomes the constraints (e.g., a threshold associated with the constraints), the memory device 110 may terminate (e.g., early terminate) the writing before completing the writing pattern (e.g., applying the writing pattern to each of the indicated memory cells 205).

In some cases, the memory device 110 may undergo the circumstances that risk imprinting before or after writing the respective logic value. For example, the memory cells 205 may be in the robust state before risk of imprinting. Alternatively, the memory cells 205 may represent imprinted memory cells 205, where writing the respective logic value may increase a likelihood of recovery (e.g., normalizing) from the imprint condition.

The process flow 500-b may illustrate a second implementation of the management procedure. For example, the process flow 500-b may include a method performed by a memory device 110 including, initiating a conditioning procedure, determining an imprint severity, selecting a writing pattern, writing memory cells 205 with a logic value, and performing a power down procedure. In the example of FIG. 5B, the memory device 110 (e.g., the device memory controller 155, the local memory controller 165, or the local memory controller 265, or any combination thereof) may apply a writing pattern to the one or more memory cells 205 before a power down procedure. For example, at 520, the memory device 110 may initiate a conditioning procedure, which may result in pre-conditioning the memory cells 205 to be in a robust state (e.g., a state that is less likely to result in imprinting than one or more other states) before power down. In some cases, the memory device 110 may initiate the conditioning procedure based on detecting the power down procedure, a pre-conditioning command from the host device 105, or both.

In some examples, at 525, the memory device 110 may optionally determine an indication of a severity of imprint of the memory cells 205. For example, the memory device 110 (e.g., the temperature component 195) may determine the indication based on receiving the indication from the host device 105, a duration of storing logic states at the memory array 170, or a temperature associated with the memory array 170 (e.g., detecting the temperature associated with the memory array 170 is outside of a temperature threshold for at least a duration threshold), or any combination thereof.

In some cases, at 530, the memory device 110 may select an imprint conditioning pattern (e.g., a writing pattern). In some examples, the imprint conditioning pattern may be a preconditioning pattern (e.g., an array operation pattern) that indicates a data state for each memory cell of the memory cells 205. The memory device 110 (e.g., the device memory controller 155, the local memory controller 165, or the local memory controller 265, or any combination thereof) may apply the indicated data state to the memory cells 205 to change the polarity of the memory cells 205 to a robust (e.g., safe) state against imprinting. The selecting may be based on the indication of the severity of imprint, power and command execution time constraints, or increasing robustness to thermal steps (e.g., in accordance to FeRAM configuration designs), or any combination thereof. In some examples, the imprint conditioning pattern may change based on various conditions, such as memory configurations scale (e.g., as FeRAM designs scale). As such, the pre-conditioning command may be agnostic to (e.g., independent of) the selected imprint conditioning pattern.

In some implementations, the memory device 110 may select the imprint conditioning pattern from a set of imprint conditioning patterns, where the host device 105 may indicate the set or the set may be preconfigured and stored at the memory device 110. In some examples, the set of imprint conditioning patterns may include different types of patterns. For example, a first pattern may indicate a same data state (e.g., a logic state 0) for each memory cell 205 of the memory cells 205. A second pattern may indicate an alternating data state (e.g., a logic state 0 then a logic state 1) for each memory cell 205, where a first portion of the memory cells 205 are in a first data state and a second portion of the memory cells 205 are in a second data state different than the first data state. Another second pattern may indicate an ordering data state (e.g., a logic state 0 then a logic state 1 then a logic state 2) for each memory cell 205, where a first portion of the memory cells 205 are in a first data state and a second portion of the memory cells 205 are in a second data state different than the first data state and a third portion of the memory cells 205 are in a third data state different than the first data state and the second data state. A third pattern may include an asymmetric switching pattern over a set of cycles, the asymmetric switching pattern indicating a first data state for a first duration for a first portion of the memory cells 205 and a second data state, different than the first, for a second duration for a second portion of the memory cells 205. For example, the third pattern may include indicating an asymmetric switching pattern for several cycles (e.g., 100 cycles), such as clock cycles or writing cycles, among other types of cycles. For example, the third pattern may indicate a first data state (e.g., a logic state 0) for a first subset of the several cycles (e.g., ten cycles) and a second data state (e.g., a logic state 1) for a second subset of the several cycles (e.g., five cycles), such that the memory device 110 may switch which data state to write after a quantity of cycles with a longer delay following the first data state than the delay following the second data state. The examples as described herein are not indicative of an exhaustive set of possible imprint conditioning patterns and other patterns are possible. The set of imprint conditioning patterns may be updated and imprint conditioning patterns may be added and omitted to the set.

At 535, the memory device 110 (e.g., the device memory controller 155, the local memory controller 165, or the local memory controller 265, or any combination thereof) may write a respective logic value to at least some of the memory cells 205 based on the selected imprint conditioning pattern. In some examples, the memory device 110 may write the respective logic value to all of the memory cells 205 or a portion of the memory cells 205 based on the stored logic value of each memory cell 205, power and time constraints, or both. The respective logic value may be associated with a robust state for decreasing a likelihood of imprinting or increasing a likelihood of recovering from imprint.

At 540, the memory device 110 may perform the power down procedure. In some cases, the power down procedure may include the conditioning procedure. For example, a first power down procedure may be a brief power down and a second power down procedure may be a relatively longer power down procedure (e.g., longer than the brief power down) that includes the conditioning procedure. For example, there may be a set of possible power down procedures for different scenarios. In some cases, a user may select a robust (e.g., complex) power down procedure to store the memory device 110 for a duration of time or for rework, among other examples, where the robust procedure may last for a longer duration than a non-robust procedure. The memory device 110 may experience thermal stress or other imprint events while powered down. However, because the memory cells 205 are in the robust state before and during the power down, the memory array 170 will be protected from excessive degradation and imprinting (e.g., relative to memory cells in a non-robust state).

The process flow 500-c may illustrate a third implementation of the management procedure. For example, the process flow 500-c may include a method performed by a memory device 110 including, determining a power state (e.g., a power down or power up state), selecting a writing pattern (e.g., an imprint conditioning pattern, or a deletion pattern, or both, among other examples), and writing memory cells 205 with a logic value. In the example of FIG. 5C, the memory device 110 (e.g., the device memory controller 155, the local memory controller 165, or the local memory controller 265, or any combination thereof) may perform a memory management procedure (e.g., a deletion procedure) after a power up procedure. For example, at 545, the memory device 110 may perform the power up procedure. In some cases, the power up procedure may include the deletion procedure. In some implementations, the deletion procedure may be an example of (e.g., similar to) the imprint conditioning procedure. The memory device 110 may determine to perform the deletion procedure on the memory cells 205 of the memory array 170 based on performing the power up procedure.

In some cases, components of the system 100 (e.g., a host device 105, the memory device 110) may refrain from granting access to a user (e.g., limiting a user interface) based on determining to perform the deletion procedure. For example, a ferroelectric capacitor 240 of the memory array 170 may hold a polarization from a previous power state (e.g., hold a data state from a last power on), which may result in decreased data security compared to volatile memories. The memory device 110 (e.g., the device memory controller 155, the local memory controller 165, or the local memory controller 265, or any combination thereof) may refrain from granting the user access to sensing the data state of the ferroelectric capacitor 240 until after the deletion procedure (e.g., a wipeout procedure) is complete. In this way, the wipeout procedure may insure data security of FeRAM (e.g., non-volatile memory) in an assumed volatile memory market by writing a sufficient subset of bits (up to all bits) to a data state upon power up and before the user can access the data. In some examples, the wipeout may be configured to be triggered on every power up procedure or some power up procedures.

At 550, the memory device 110 may initiate the deletion procedure. In some cases, the deletion procedure may be similar to the imprint conditioning procedure. For example, the memory device 110 may select a writing pattern (e.g., a deletion pattern) at 555. The deletion pattern may indicate a same data state for each memory cell 205, an alternating data state for each memory cell 205, or an symmetric switching pattern over a set of cycles, or any combination thereof, as described herein with reference to FIG. 5B. For example, the memory device 110 may select the deletion pattern based on a level of security (e.g., a higher or lower probability of data security) or one or more constraints associated with power on (e.g., time, power, or other constraints), among other examples, or any combination thereof.

At 560, the memory device 110 (e.g., the device memory controller 155, the local memory controller 165, or the local memory controller 265, or any combination thereof) may write a respective logic value to at least some of the memory cells 205 based on the selected deletion pattern. In some cases, the respective logic value may be an example of a data state that is a robust state against imprinting. After the memory device 110 completes writing the respective logic value to the memory cells 205, at 565, the user may optionally receive access to (e.g., be granted access to) the memory cells 205 (e.g., reading and writing to the memory cells 205). In some implementations, the memory device 110 may give incremental access to the user upon writing the memory cells 205. For example, the memory device 110 may give access of the written memory cells 205 to the user after the writing step is completed or incrementally give access as the memory device 110 completes writing to each memory cell 205, such that the user may have access to a portion of the written memory cells 205 before the deletion procedure is completed.

In some examples, the memory device 110 may perform both the deletion procedure and the imprint conditioning procedure. For example, the memory device 110 may perform the power up procedure. The memory device 110 may determine to perform the deletion procedure based on the power up procedure. The memory device 110 may write a first logic value to at least some of the memory cells 205 in accordance with the deletion pattern and then perform normal operation. The memory device 110 may detect a power down or a preconditioning command (e.g., a user command) and determine to perform the imprint conditioning procedure. The memory device 110 may write a second logic value to at least some of the memory cells 205 in accordance with the imprint conditioning pattern. After completing the imprint conditioning procedure the memory device 110 may power down. In some cases, performing both the deletion procedure and the imprint conditioning procedure results in decreased imprint probability, increased probability for imprint recovery, and enhanced data security, among other benefits. In some examples, the first logic value and the second logic value may be different logic values.

In some cases, the memory array 170 may include a configuration of multiple pairs of memory cells 205 that are configured to store a single bit of information between the pairs, each pair including a first memory cell 205 and a second memory cell 205, as described herein with reference to FIG. 2. In some examples, the pairs of memory cells 205 may provide an increased level of complexity to the imprint conditioning patterns and the deletion patterns. For example, the first memory cell 205 may be in a first logic state and the second memory cell 205 may be in a second logic state different than the first logic state, such that one memory cell 205 of the pair of memory cells 205 may include a robust state and one memory cell 205 of the pair of memory cells 205 may include a non-robust state. Therefore, the deletion pattern and the imprint conditioning pattern may indicate a same logic state (e.g., a robust state) for both the first and second memory cells 205 (e.g., inducing an indeterminate or "random" information bit as there is minimal to no difference between voltages of the first memory cell 205 and the second memory cell 205) such that the pairs of memory cells 205 undergo bake in the robust (e.g., desirable) state instead of one or more other states.

In some cases, the patterns may also indicate a third logic state and a fourth logic state different than the third logic state for the first and second memory cells 205 after the bake. For example, the memory device 105 may write a logic state 0 to the first memory cell 205 and a logic state 0 to the second memory cell 205. Before continuing normal operation, the memory device 105 may then write a logic state 1 to the first memory cell 205 and a logic state 0 to the second memory cell 205, such that the final status of the pair of memory cells 205 are uncorrelated with a previous status (e.g., before power down). In some implementations, the memory device 110 may determine to write the third and fourth logic states such that they are the same, different, or uncorrelated with a history of the previous first and second logic states respectively. In some implementations, the patterns may indicate the third logic state without the fourth logic state based on the history of the previous first and second logic states, such that the third logic state is applied to either the first memory cell 205 or the second memory cell 205 to form a clear logic state (e.g., a clear difference between the logic state of the first memory cell 205 and the second memory cell 205). For example, each memory cell of a memory cell pair may include a logic state 0. Thus, the pattern may indicate a logic state 1 for one of the memory cells of the pair.

Although the illustrative examples described herein generally relate to FeRAM memory, the proposed methods may also generally apply to both two dimensional and three dimensional memory (e.g., including cross-point memory), resistive memory, spin-transfer torque RAM (STTRAM), and MRAM, among others.

Figure 6:
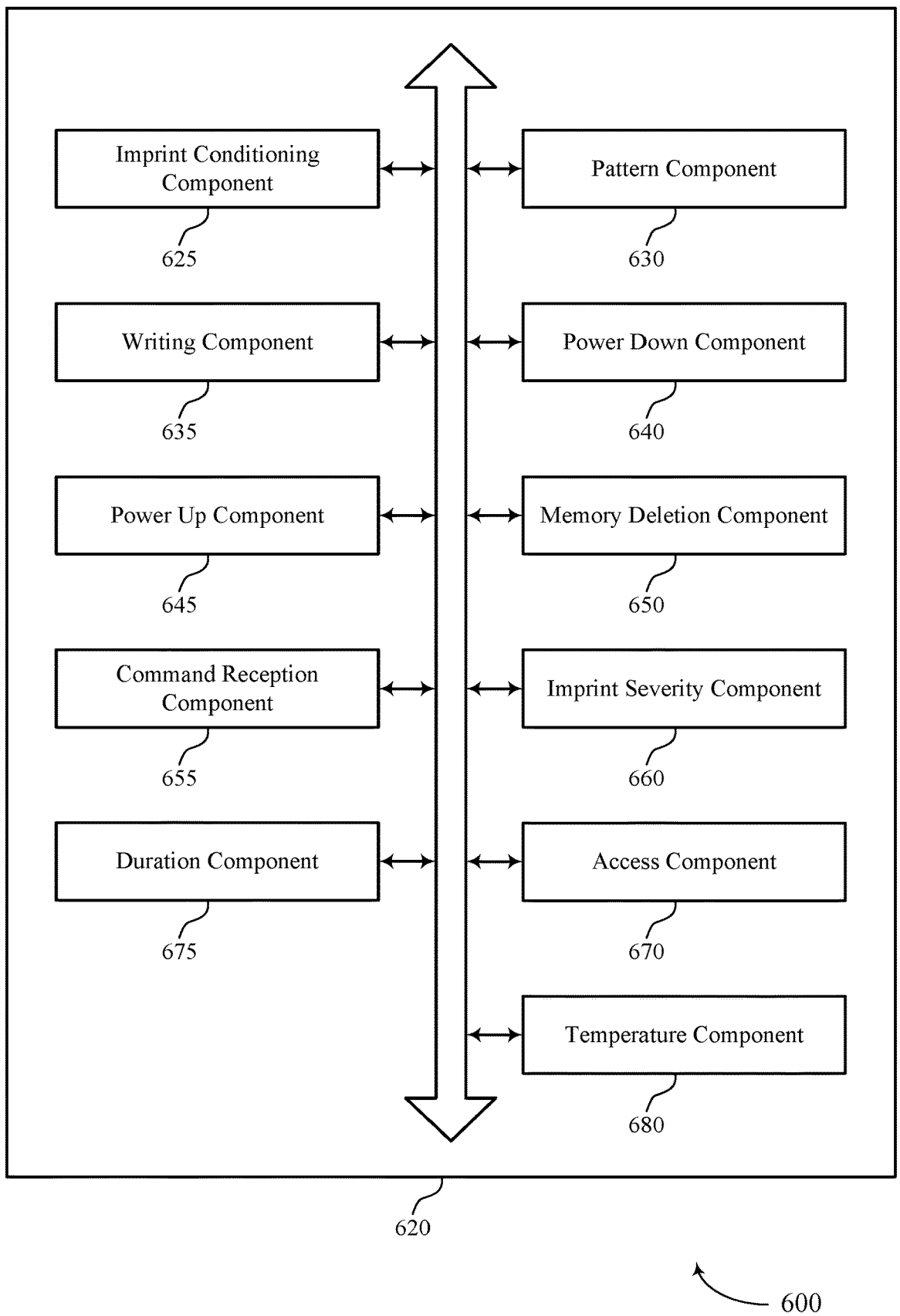
FIG. 6 shows a block diagram of a memory device that supports robust functionality for memory management associated with high-temperature storage and other conditions in accordance with examples as disclosed herein.

FIG. 6 shows a block diagram 600 of a memory device 620 that supports robust functionality for memory management associated with high-temperature storage in accordance with examples as disclosed herein. The memory device 620 may be an example of aspects of a memory device as described with reference to FIGS. 1 through 5. The memory device 620, or various components thereof, may be an example of means for performing various aspects of robust functionality for memory management associated with high-temperature storage as described herein. For example, the memory device 620 may include an imprint conditioning component 625, a pattern component 630, a writing component 635, a power down component 640, a power up component 645, a memory deletion component 650, a command reception component 655, an imprint severity component 660, an access component 670, a duration component 675, or a temperature component 680, or any combination thereof. Each of these components may communicate, directly or indirectly, with one another (e.g., via one or more buses).

The imprint conditioning component 625 may be configured as or otherwise support a means for determining to perform an imprint conditioning procedure on one or more memory cells of a memory array of a memory device based at least in part on an indication of a power down of the memory device. One example of this means may be or include the memory device 110, the device memory controller 155, the local memory controller 165, or the local memory controller 265, or other components or any combination thereof. The pattern component 630 may be configured as or otherwise support a means for optionally selecting an imprint conditioning pattern based at least in part on determining to perform the imprint conditioning procedure, the imprint conditioning pattern indicating a data state for each memory cell of the one or more memory cells. One example of this means may be or include the memory device 110, the device memory controller 155, the local memory controller 165, or the local memory controller 265, or other components or any combination thereof. The writing component 635 may be configured as or otherwise support a means for writing a respective logic value to at least one of the one or more memory cells in accordance with an imprint conditioning pattern based at least in part on determining to perform the imprint conditioning procedure. One example of this means may be or include the memory device 110, the device memory controller 155, the local memory controller 165, or the local memory controller 265, or other components or any combination thereof. The power down component 640 may be configured as or otherwise support a means for performing the power down of the memory device based at least in part on the indication of the power down and writing the respective logic value to the at least some of the one or more memory cells. One example of this means may be or include the memory device 110, the device memory controller 155, the local memory controller 165, or the local memory controller 265, or other components or any combination thereof.

In some examples, the command reception component 655 may be configured as or otherwise support a means for receiving a command from a host device, where determining to perform the imprint conditioning procedure is based at least in part on the command from the host device indicating to perform imprint conditioning. One example of this means may be or include a receiver in the memory device 110, the device memory controller 155, the local memory controller 165, or the local memory controller 265, or other components or any combination thereof.

In some examples, the imprint conditioning pattern indicates a same data state for each memory cell of the one or more memory cells.

In some examples, the imprint conditioning pattern indicates an alternating data state for each memory cell of the one or more memory cells.

In some examples, the imprint conditioning pattern includes an asymmetric switching pattern over a plurality of cycles, the asymmetric switching pattern indicating a first data state for a first duration for at least some of the one or more memory cells and a second data state for a second duration for at least some of the one or more memory cells.

In some examples, the imprint severity component 660 may be configured as or otherwise support a means for determining an indication of a severity of imprint of the one or more memory cells of the memory array, where selecting the imprint conditioning pattern is based at least in part on the indication of the severity of imprint. One example of this means may be or include the memory device 110, the device memory controller 155, the local memory controller 165, or the local memory controller 265, or other components or any combination thereof.

In some examples, the duration component 675 may be configured as or otherwise support a means for determining a duration of storing logic states at the memory array, where determining the indication of the severity of imprint is based at least in part on the duration of storing logic states. One example of this means may be or include the memory device 110, the device memory controller 155, the local memory controller 165, or the local memory controller 265, or other components or any combination thereof.

In some examples, the temperature component 680 may be configured as or otherwise support a means for determining a temperature associated with the memory array, where determining the indication of the severity of imprint is based at least in part on the temperature. One example of this means may be or include a temperature component 195 (e.g., a temperature sensor), the memory device 110, the device memory controller 155, the local memory controller 165, or the local memory controller 265, or other components or any combination thereof.

In some examples, to support determining the temperature associated with the memory array, the temperature component 680 may be configured as or otherwise support a means for detecting the temperature associated with the memory array is outside a temperature threshold for at least a duration threshold. One example of this means may be or include a temperature component 195 (e.g., a temperature sensor), the memory device 110, the device memory controller 155, the local memory controller 165, or the local memory controller 265, or other components or any combination thereof.

In some examples, the one or more memory cells include one or more pairs of memory cells configured to store a single bit of information, each pair of memory cells including a first memory cell and a second memory cell. In some examples, the imprint conditioning pattern indicating a data state for the each pair of memory cells, or a first data state for the first memory cell and a second data state for the second memory cell of the each pair of memory cells.

In some examples, the writing component 635 may be configured as or otherwise support a means for writing the respective logic value to at least the first memory cell of the each pair of memory cells based at least in part on the imprint conditioning pattern. One example of this means may be or include the memory device 110, the device memory controller 155, the local memory controller 165, or the local memory controller 265, or other components or any combination thereof.

The power up component 645 may be configured as or otherwise support a means for performing a power up procedure of a memory device. The memory deletion component 650 may be configured as or otherwise support a means for determining to perform a memory deletion procedure on one or more memory cells of a memory array of the memory device based at least in part on the power up procedure of the memory device. One example of this means may be or include the memory device 110, the device memory controller 155, the local memory controller 165, or the local memory controller 265, or other components or any combination thereof. In some examples, the pattern component 630 may be configured as or otherwise support a means for optionally selecting a deletion pattern based at least in part on determining to perform the memory deletion procedure, the deletion pattern indicating a data state for each memory cell of the one or more memory cells. One example of this means may be or include the memory device 110, the device memory controller 155, the local memory controller 165, or the local memory controller 265, or other components or any combination thereof. In some examples, the writing component 635 may be configured as or otherwise support a means for writing a respective logic value to at least one of the one or more memory cells in accordance with a deletion pattern based at least in part on determining to perform the deletion procedure. One example of this means may be or include the memory device 110, the device memory controller 155, the local memory controller 165, or the local memory controller 265, or other components or any combination thereof.

In some examples, the access component 670 may be configured as or otherwise support a means for refraining from granting access to a user based at least in part on determining to perform the memory deletion procedure. One example of this means may be or include the memory device 110, the device memory controller 155, the local memory controller 165, or the local memory controller 265, or other components or any combination thereof. In some examples, the access component 670 may be configured as or otherwise support a means for granting access to the user based at least in part on completing the memory deletion procedure. One example of this means may be or include the memory device 110, the device memory controller 155, the local memory controller 165, or the local memory controller 265, or other components or any combination thereof.

In some examples, the deletion pattern indicates a same data state for each memory cell of the one or more memory cells.

In some examples, the deletion pattern indicates an alternating data state for each memory cell of the one or more memory cells.

In some examples, the deletion pattern includes an asymmetric switching pattern over a plurality of cycles, the asymmetric switching pattern indicating a first data state for a first duration for at least some of the one or more memory cells and a second data state for a second duration for at least some of the one or more memory cells.

In some examples, the one or more memory cells include one or more pairs of memory cells configured to store a single bit of information, each pair of memory cells including a first memory cell and a second memory cell. In some examples, the deletion pattern indicating a data state for the each pair of memory cells or a first data state for the first memory cell and a second data state for the second memory cell of the each pair of memory cells.

In some examples, the writing component 635 may be configured as or otherwise support a means for writing the respective logic value to at least the first memory cell of the each pair of memory cells based at least in part on the deletion pattern. One example of this means may be or include the memory device 110, the device memory controller 155, the local memory controller 165, or the local memory controller 265, or other components or any combination thereof.

Figure 7:
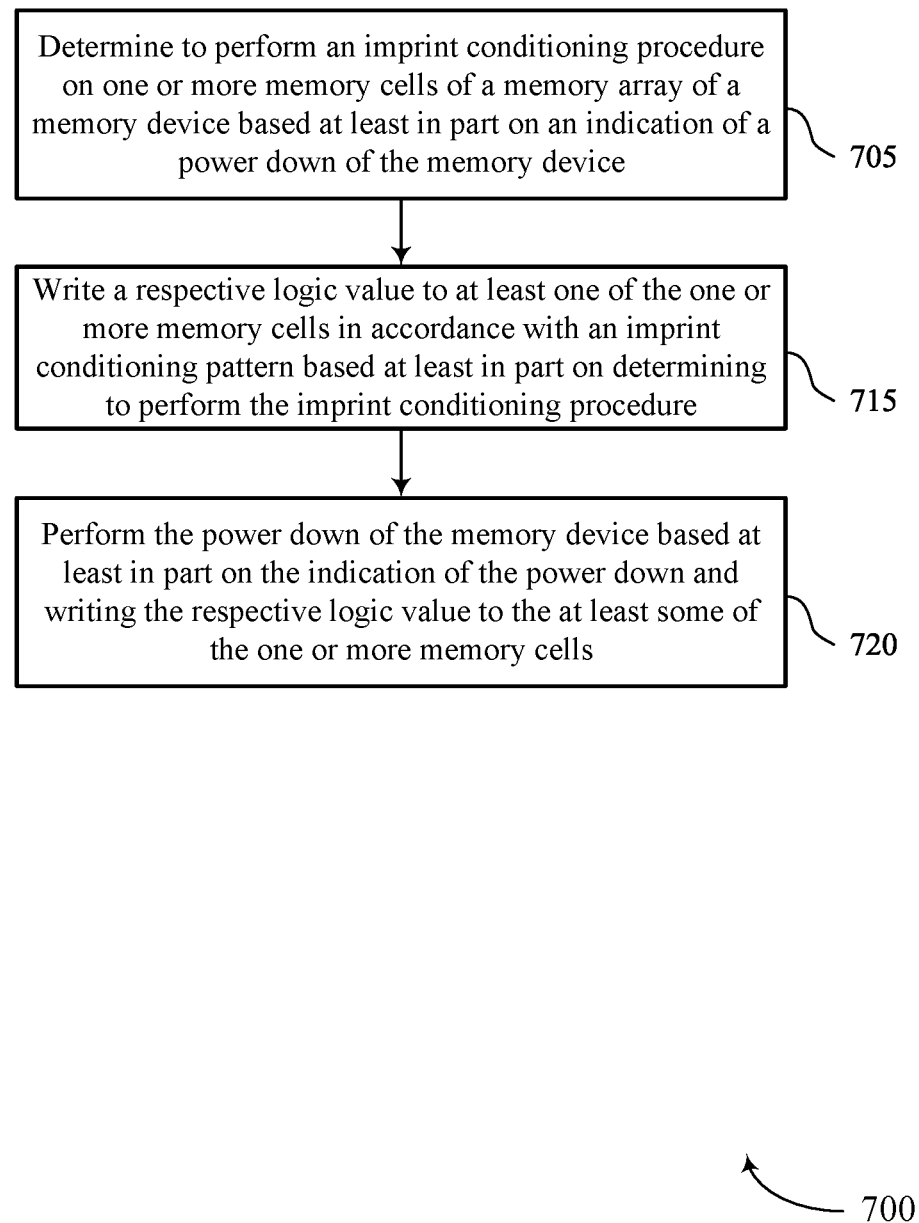
FIGS. 7 and 8 show flowcharts illustrating a method or methods that support robust functionality for memory management associated with high-temperature storage and other conditions in accordance with examples as disclosed herein.

FIG. 7 shows a flowchart illustrating a method 700 that supports robust functionality for memory management associated with high-temperature storage in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 705, the method may include determining to perform an imprint conditioning procedure on one or more memory cells of a memory array of a memory device based at least in part on an indication of a power down of the memory device. The operations of 705 may be performed in accordance with examples as disclosed herein. In some examples, aspects of the operations of 705 may be performed by an imprint conditioning component 625 as described with reference to FIG. 6.

The method may optionally include selecting an imprint conditioning pattern based at least in part on determining to perform the imprint conditioning procedure, the imprint conditioning pattern indicating a data state for each memory cell of the one or more memory cells. The selecting may be performed in accordance with examples as disclosed herein. In some examples, aspects of the selecting may be performed by a pattern component 630 as described with reference to FIG. 6.

At 715, the method may include writing a respective logic value to at least one of the one or more memory cells in accordance with an imprint conditioning pattern based at least in part on determining to perform the imprint conditioning procedure. The operations of 715 may be performed in accordance with examples as disclosed herein. In some examples, aspects of the operations of 715 may be performed by a writing component 635 as described with reference to FIG. 6.

At 720, the method may include performing the power down of the memory device based at least in part on the indication of the power down and writing the respective logic value to the at least some of the one or more memory cells. The operations of 720 may be performed in accordance with examples as disclosed herein. In some examples, aspects of the operations of 720 may be performed by a power down component 640 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for determining to perform an imprint conditioning procedure on one or more memory cells of a memory array of a memory device based at least in part on an indication of a power down of the memory device; writing a respective logic value to at least one of the one or more memory cells in accordance with an imprint conditioning pattern based at least in part on determining to perform the imprint conditioning procedure; and performing the power down of the memory device based at least in part on the indication of the power down and writing the respective logic value to the at least some of the one or more memory cells.

Aspect 2: The method, apparatus, or non-transitory computer-readable medium of aspect 1, further including operations, features, circuitry, logic, means, or instructions, or any combination thereof for receiving a command from a host device, where determining to perform the imprint conditioning procedure is based at least in part on the command from the host device indicating to perform imprint conditioning.

Aspect 3: The method, apparatus, or non-transitory computer-readable medium of aspect 1, further including operations, features, circuitry, logic, means, or instructions, or any combination thereof for selecting the imprint conditioning pattern based at least in part on determining to perform the imprint conditioning procedure, the imprint conditioning pattern indicating a data state for each memory cell of the one or more memory cells.

Aspect 4: The method, apparatus, or non-transitory computer-readable medium of any of aspects 1 through 2 where the imprint conditioning pattern indicates a same data state for each memory cell of the one or more memory cells.

Aspect 5: The method, apparatus, or non-transitory computer-readable medium of any of aspects 1 through 4 where the imprint conditioning pattern indicates an alternating data state for each memory cell of the one or more memory cells.

Aspect 6: The method, apparatus, or non-transitory computer-readable medium of any of aspects 1 through 5 where the imprint conditioning pattern includes an asymmetric switching pattern over a plurality of cycles, the asymmetric switching pattern indicating a first data state for a first duration for at least some of the one or more memory cells and a second data state for a second duration for at least some of the one or more memory cells.

Aspect 7: The method, apparatus, or non-transitory computer-readable medium of any of aspects 1 through 6, further including operations, features, circuitry, logic, means, or instructions, or any combination thereof for determining an indication of a severity of imprint of the one or more memory cells of the memory array, where selecting the imprint conditioning pattern is based at least in part on the indication of the severity of imprint.

Aspect 8: The method, apparatus, or non-transitory computer-readable medium of aspect 7, further including operations, features, circuitry, logic, means, or instructions, or any combination thereof for determining a duration of storing logic states at the memory array, where determining the indication of the severity of imprint is based at least in part on the duration of storing logic states.

Aspect 9: The method, apparatus, or non-transitory computer-readable medium of any of aspects 7 through 8, further including operations, features, circuitry, logic, means, or instructions, or any combination thereof for determining a temperature associated with the memory array, where determining the indication of the severity of imprint is based at least in part on the temperature.

Aspect 10: The method, apparatus, or non-transitory computer-readable medium of aspect 9 where determining the temperature associated with the memory array, further includes operations, features, circuitry, logic, means, or instructions, or any combination thereof for detecting the temperature associated with the memory array is outside a temperature threshold for at least a duration threshold.

Aspect 11: The method, apparatus, or non-transitory computer-readable medium of any of aspects 1 through 10 where the one or more memory cells include one or more pairs of memory cells configured to store a single bit of information, each pair of memory cells including a first memory cell and a second memory cell and the imprint conditioning pattern indicating a data state for the each pair of memory cells, or a first data state for the first memory cell and a second data state for the second memory cell of the each pair of memory cells.

Aspect 12: The method, apparatus, or non-transitory computer-readable medium of aspect 11, further including operations, features, circuitry, logic, means, or instructions, or any combination thereof for writing the respective logic value to at least the first memory cell of the each pair of memory cells based at least in part on the imprint conditioning pattern.

Figure 8:
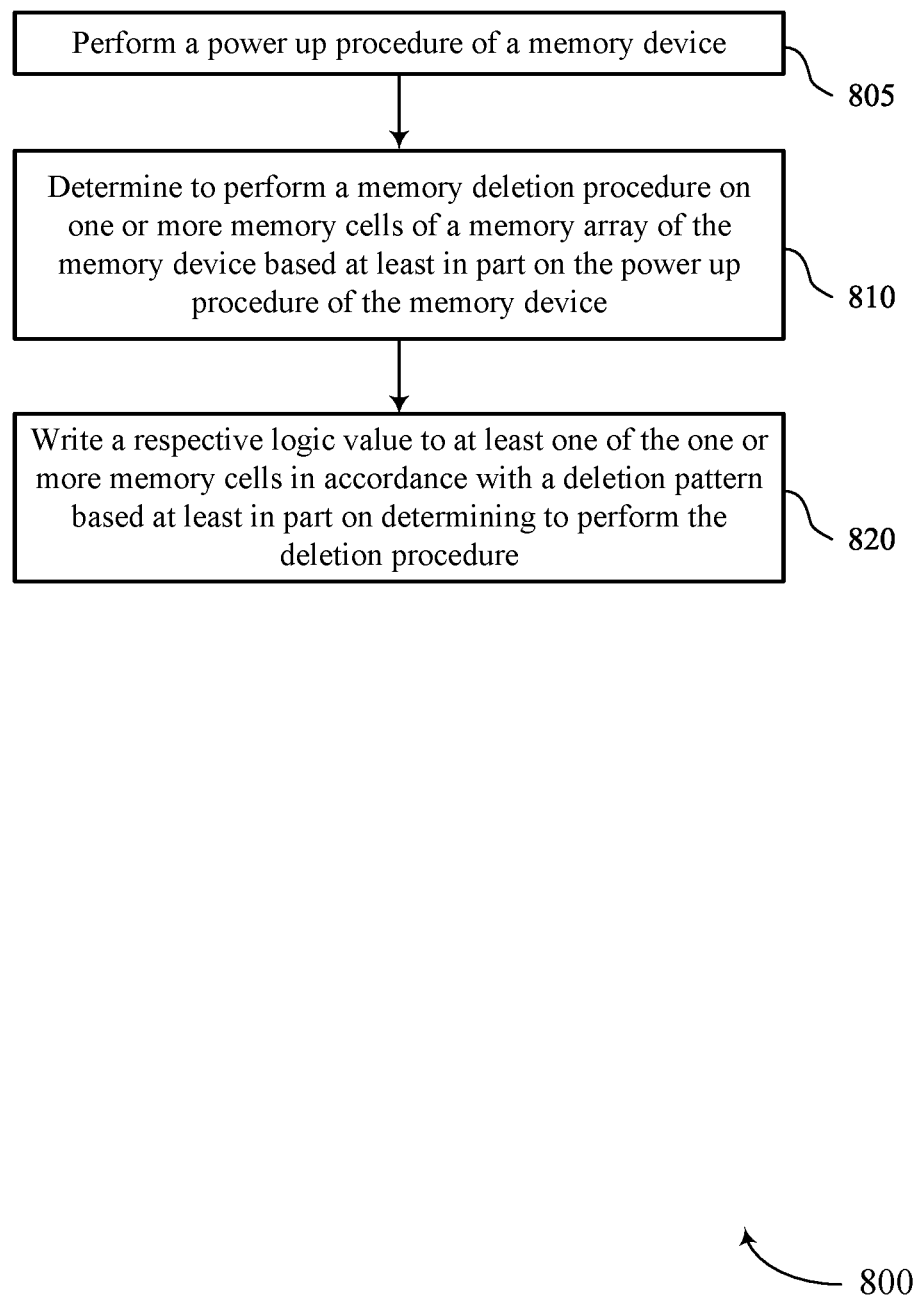

FIG. 8 shows a flowchart illustrating a method 800 that supports robust functionality for memory management associated with high-temperature storage in accordance with examples as disclosed herein. The operations of method 800 may be implemented by a memory device or its components as described herein. For example, the operations of method 800 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 805, the method may include performing a power up procedure of a memory device. The operations of 805 may be performed in accordance with examples as disclosed herein. In some examples, aspects of the operations of 805 may be performed by a power up component 645 as described with reference to FIG. 6.

At 810, the method may include determining to perform a memory deletion procedure on one or more memory cells of a memory array of the memory device based at least in part on the power up procedure of the memory device. The operations of 810 may be performed in accordance with examples as disclosed herein. In some examples, aspects of the operations of 810 may be performed by a memory deletion component 650 as described with reference to FIG. 6.

The method may optionally include selecting a deletion pattern based at least in part on determining to perform the memory deletion procedure, the deletion pattern indicating a data state for each memory cell of the one or more memory cells. The selecting may be performed in accordance with examples as disclosed herein. In some examples, aspects of the selecting may be performed by a pattern component 630 as described with reference to FIG. 6.

At 820, the method may include writing a respective logic value to at least one of the one or more memory cells in accordance with a deletion pattern based at least in part on selecting the deletion pattern. The operations of 820 may be performed in accordance with examples as disclosed herein. In some examples, aspects of the operations of 820 may be performed by a writing component 635 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 13: A method, apparatus, or non-transitory computer-readable medium including operations, features, circuitry, logic, means, or instructions, or any combination thereof for performing a power up procedure of a memory device; determining to perform a memory deletion procedure on one or more memory cells of a memory array of the memory device based at least in part on the power up procedure of the memory device; and writing a respective logic value to at least one of the one or more memory cells in accordance with a deletion pattern based at least in part on determining to perform the deletion procedure.

Aspect 14: The method, apparatus, or non-transitory computer-readable medium of aspect 13, further including operations, features, circuitry, logic, means, or instructions, or any combination thereof for refraining from granting access to a user based at least in part on determining to perform the memory deletion procedure and granting access to the user based at least in part on completing the memory deletion procedure.

Aspect 15: The method, apparatus, or non-transitory computer-readable medium of aspect 19, further including operations, features, circuitry, logic, means, or instructions, or any combination thereof for selecting the deletion pattern based at least in part on determining to perform the memory deletion procedure, the deletion pattern indicating a data state for each memory cell of the one or more memory cells.

Aspect 16: The method, apparatus, or non-transitory computer-readable medium of any of aspects 13 through 14 where the deletion pattern indicates a same data state for each memory cell of the one or more memory cells.

Aspect 17: The method, apparatus, or non-transitory computer-readable medium of any of aspects 13 through 16 where the deletion pattern indicates an alternating data state for each memory cell of the one or more memory cells.

Aspect 18: The method, apparatus, or non-transitory computer-readable medium of any of aspects 13 through 17 where the deletion pattern includes an asymmetric switching pattern over a plurality of cycles, the asymmetric switching pattern indicating a first data state for a first duration for at least some of the one or more memory cells and a second data state for a second duration for at least some of the one or more memory cells.

Aspect 19: The method, apparatus, or non-transitory computer-readable medium of any of aspects 13 through 18 where the one or more memory cells include one or more pairs of memory cells configured to store a single bit of information, each pair of memory cells including a first memory cell and a second memory cell and the deletion pattern indicating a data state for the each pair of memory cells or a first data state for the first memory cell and a second data state for the second memory cell of the each pair of memory cells.

Aspect 20: The method, apparatus, or non-transitory computer-readable medium of aspect 19, further including operations, features, circuitry, logic, means, or instructions, or any combination thereof for writing the respective logic value to at least the first memory cell of the each pair of memory cells based at least in part on the deletion pattern.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 21: An apparatus, including: a memory array; and a controller coupled with the memory array and operable to cause the apparatus to: determine to perform an imprint conditioning procedure on one or more memory cells of the memory array of a memory device based at least in part on an indication of a power state procedure of the memory device; and write a respective logic value to the at least one of the one or more memory cells in accordance with an imprint conditioning pattern based at least in part on the determining to perform the imprint conditioning procedure.

Aspect 22: The apparatus of aspect 21, where the controller is further operable to cause the apparatus to: perform a power up procedure of the memory device; determine to perform a memory deletion procedure on first one or more memory cells of the memory array based at least in part on an indication of the power up procedure; select a deletion pattern based at least in part on determining to perform the memory deletion procedure, the deletion pattern indicating a first data state for at least some of the first one or more memory cells; and write a first respective logic value to at least one of the first one or more memory cells based at least in part on the deletion pattern.

Aspect 23: The apparatus of aspect 22, where the controller is further operable to cause the apparatus to: determine to perform a second imprint conditioning procedure on second one or more memory cells of the memory array based at least in part on an indication of a power down procedure; select a second imprint conditioning pattern based at least in part on determining to perform the second imprint conditioning procedure, the second imprint conditioning pattern indicating a second data state for at least some of the second one or more memory cells; write a second respective logic value to at least one of the second one or more memory cells based at least in part on the second imprint conditioning pattern; and perform the power down procedure of the memory device.

Aspect 24: The apparatus of any of aspects 21 through 23, where the controller is further operable to cause the apparatus to: determine to perform the imprint conditioning procedure on the one or more memory cells of the memory array based at least in part on an indication of a power down procedure; and perform the power down procedure of the memory device.

Aspect 25: The apparatus of any of aspects 21 through 24, where the power state procedure includes a power up state procedure, a power down state procedure, or both.

Aspect 26: The apparatus of any of aspects 21 through 25, where: the memory array includes one or more pairs of memory cells configured to store a single bit of information, each pair of memory cells including a first memory cell and a second memory cell, the pair of memory cells; and the controller is further operable to select the imprint conditioning pattern based at least in part on the one or more pairs of memory cells, the imprint conditioning pattern indicating a data state for the each pair of memory cells or a first data state for the first memory cell and a second data state for the second memory cell of the each pair of memory cells.

Aspect 27: The apparatus of any of aspects 21 through 26, where the controller is further operable to cause the apparatus to: write a first logic value to the at least some of the one or more memory cells based at least in part on a power down procedure; and write a second logic value, different than the first logic value, to the at least some of the one or more memory cells based at least in part on a power up procedure.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, or other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   determining to perform an imprint conditioning procedure on one or more memory cells of a memory array of a memory device based at least in part on an indication of a power down of the memory device;
   writing a respective logic value to at least one of the one or more memory cells in accordance with an imprint conditioning pattern based at least in part on determining to perform the imprint conditioning procedure; and
   performing the power down of the memory device based at least in part on the indication of the power down and writing the respective logic value to the at least one of the one or more memory cells.

2. The method of claim 1, further comprising:
   receiving a command from a host device, wherein determining to perform the imprint conditioning procedure is based at least in part on the command from the host device indicating to perform imprint conditioning.

3. The method of claim 1, further comprising:
   selecting the imprint conditioning pattern based at least in part on determining to perform the imprint conditioning procedure, the imprint conditioning pattern indicating a data state for each memory cell of the one or more memory cells.

4. The method of claim 1, wherein the imprint conditioning pattern indicates a same data state for each memory cell of the one or more memory cells.

5. The method of claim 1, wherein the imprint conditioning pattern indicates an alternating data state for each memory cell of the one or more memory cells.

6. The method of claim 1, wherein the imprint conditioning pattern comprises an asymmetric switching pattern over a plurality of cycles, the asymmetric switching pattern indicating a first data state for a first duration for at least some of the one or more memory cells and a second data state for a second duration for at least some of the one or more memory cells.

7. The method of claim 1, further comprising:
   determining an indication of a severity of imprint of the one or more memory cells of the memory array, wherein selecting the imprint conditioning pattern is based at least in part on the indication of the severity of imprint.

8. The method of claim 7, further comprising:
   determining a duration of storing logic states at the memory array, wherein determining the indication of the severity of imprint is based at least in part on the duration of storing logic states.

9. The method of claim 7, further comprising:
   determining a temperature associated with the memory array, wherein determining the indication of the severity of imprint is based at least in part on the temperature.

10. The method of claim 9, wherein determining the temperature associated with the memory array further comprises:
    detecting the temperature associated with the memory array is outside a temperature threshold for at least a duration threshold.

11. The method of claim 1, wherein:
    the one or more memory cells comprise one or more pairs of memory cells configured to store a single bit of information, each pair of memory cells comprising a first memory cell and a second memory cell; and
    the imprint conditioning pattern indicating a data state for each pair of memory cells, or a first data state for the first memory cell and a second data state for the second memory cell of each pair of memory cells.

12. The method of claim 11, further comprising:
    writing the respective logic value to at least the first memory cell of each pair of memory cells based at least in part on the imprint conditioning pattern.

13. A method, comprising:
    performing a power up procedure of a memory device;
    determining to perform a memory deletion procedure on one or more memory cells of a memory array of the memory device based at least in part on the power up procedure of the memory device; and writing a respective logic value to at least one of the one or more memory cells in accordance with an imprint conditioning pattern based at least in part on determining to perform the memory deletion procedure.

14. The method of claim 13, further comprising:
refraining from granting access to a user based at least in part on determining to perform the memory deletion procedure; and
granting access to the user based at least in part on completing the memory deletion procedure.

15. The method of claim 13, wherein the imprint conditioning pattern indicates a same data state for each memory cell of the one or more memory cells or an alternating data state for each memory cell of the one or more memory cells.

16. The method of claim 13, wherein the imprint conditioning pattern comprises an asymmetric switching pattern over a plurality of cycles, the asymmetric switching pattern indicating a first data state for a first duration for at least some of the one or more memory cells and a second data state for a second duration for at least some of the one or more memory cells.

17. The method of claim 13, wherein:
the one or more memory cells comprise one or more pairs of memory cells configured to store a single bit of information, each pair of memory cells comprising a first memory cell and a second memory cell; and
the imprint conditioning pattern indicates a data state for each pair of memory cells or a first data state for the first memory cell and a second data state for the second memory cell of each pair of memory cells.

18. The method of claim 17, further comprising:
writing the respective logic value to at least the first memory cell of each pair of memory cells based at least in part on the imprint conditioning pattern.

19. An apparatus, comprising:
a memory array; and
a controller coupled with the memory array and operable to cause the apparatus to:
determine to perform an imprint conditioning procedure on one or more memory cells of the memory array of a memory device based at least in part on an indication of a power state procedure of the memory device; and
write a respective logic value to at least one of the one or more memory cells in accordance with an imprint conditioning pattern based at least in part on determining to perform the imprint conditioning procedure.

20. The apparatus of claim 19, wherein the controller is further operable to cause the apparatus to:
perform a power up procedure of the memory device;
determine to perform a memory deletion procedure on first one or more memory cells of the memory array based at least in part on an indication of the power up procedure;
select a deletion pattern based at least in part on determining to perform the memory deletion procedure, the deletion pattern indicating a first data state for at least some of the first one or more memory cells; and
write a first respective logic value to at least one of the first one or more memory cells based at least in part on the deletion pattern.

21. The apparatus of claim 20, wherein the controller is further operable to cause the apparatus to:
determine to perform a second imprint conditioning procedure on second one or more memory cells of the memory array based at least in part on an indication of a power down procedure;
select a second imprint conditioning pattern based at least in part on determining to perform the second imprint conditioning procedure, the second imprint conditioning pattern indicating a second data state for at least some of the second one or more memory cells;
write a second respective logic value to at least one of the second one or more memory cells based at least in part on the second imprint conditioning pattern; and
perform the power down procedure of the memory device.

22. The apparatus of claim 19, wherein the controller is further operable to cause the apparatus to:
determine to perform the imprint conditioning procedure on the one or more memory cells of the memory array based at least in part on an indication of a power down procedure; and
perform the power down procedure of the memory device.

23. The apparatus of claim 19, wherein the power state procedure comprises a power up state procedure, a power down state procedure, or both.

24. The apparatus of claim 19, wherein:
the memory array comprises one or more pairs of memory cells configured to store a single bit of information, each pair of memory cells comprising a first memory cell and a second memory cell; and
the controller is further operable to select the imprint conditioning pattern based at least in part on the one or more pairs of memory cells, the imprint conditioning pattern indicating a data state for each pair of memory cells or a first data state for the first memory cell and a second data state for the second memory cell of each pair of memory cells.

25. The apparatus of claim 19, wherein the controller is further operable to cause the apparatus to:
write a first logic value to the at least one of the one or more memory cells based at least in part on a power down procedure; and
write a second logic value, different than the first logic value, to the at least one of the one or more memory cells based at least in part on a power up procedure.

* * * * *